United States Patent [19]
Bitzer et al.

[11] Patent Number: 5,381,425
[45] Date of Patent: Jan. 10, 1995

[54] SYSTEM FOR ENCODING AND DECODING OF CONVOLUTIONALLY ENCODED DATA

[75] Inventors: Donald L. Bitzer, Urbana, Ill.;
Mladen A. Vouk; Vijay Srinivasan, both of Cary, N.C.; Sunny K. Lo, Raleigh, N.C.; Ajay Dholakia, Raleigh, N.C.; Elena M. Gonzalez, Raleigh, N.C.; Tina M. Lee, Raleigh, N.C.; LiFeng Wang, Raleigh, N.C.; Havish Koorapaty, Raleigh, N.C.

[73] Assignee: North Carolina State University, Raleigh, N.C.

[21] Appl. No.: 858,713

[22] Filed: Mar. 27, 1992

[51] Int. Cl.⁶ .......................................... H03M 13/00
[52] U.S. Cl. ........................................ 371/43; 371/44; 371/45
[58] Field of Search ............................... 371/43, 44, 45

[56] References Cited

U.S. PATENT DOCUMENTS

| | | | |
|---|---|---|---|
| 4,159,469 | 6/1979 | Zdunek | 340/146.1 |
| 4,317,202 | 2/1982 | Markwitz | 371/43 |
| 4,623,999 | 11/1986 | Patterson | 371/37 |
| 4,669,084 | 5/1987 | Hartman et al. | 371/43 |
| 5,014,276 | 5/1991 | Bush et al. | 371/43 |
| 5,077,743 | 12/1991 | Bitzer et al. | 371/43 |
| 5,181,231 | 1/1993 | Parikh et al. | 377/26 |

Primary Examiner—Robert W. Beausoliel, Jr.
Assistant Examiner—Joseph E. Palys
Attorney, Agent, or Firm—Perman & Green

[57] ABSTRACT

A convolutional encoding/decoding system encodes a data bit stream into n bit parity sets from k bit data bit sets, using code words of length L. The system is dependent upon the finding that unique data to parity tables can be generated where both data and parity bit blocks are w bits in length. The value of $w = n(L-k)/(n-k)$. An encoded parity bit stream is subjected to Exclusive OR operation through a connection mask or masks that are dependent upon the encoding code words. The Exclusive OR operation generates syndrome symbols indicative of the presence of errors in the parity bit stream and which are employed to address a correction table. Parity correction values are derived from the correction table and are used to revise the parity bit stream, which is then decoded, using a parity to data table. A number of parity correction procedures are disclosed.

19 Claims, 8 Drawing Sheets

UNCORRUPTED PARITY
```
              PARITY                      DATA
           1000101000010110  ←——————→  1011011110
T0 —       1000              ←——————→  1011
T1 —         0010            ←——————→    0110
T2 —          1010           ←——————→     1101
T3 —            10000        ←——————→       1011
T4 —             ETC.                         ETC.
```
— EXCL OR FOR EACH COLUMN OF OVERLAPPING BITS = 0
— DATA INDEPENDENT
FIG. 1
(PRIOR ART)
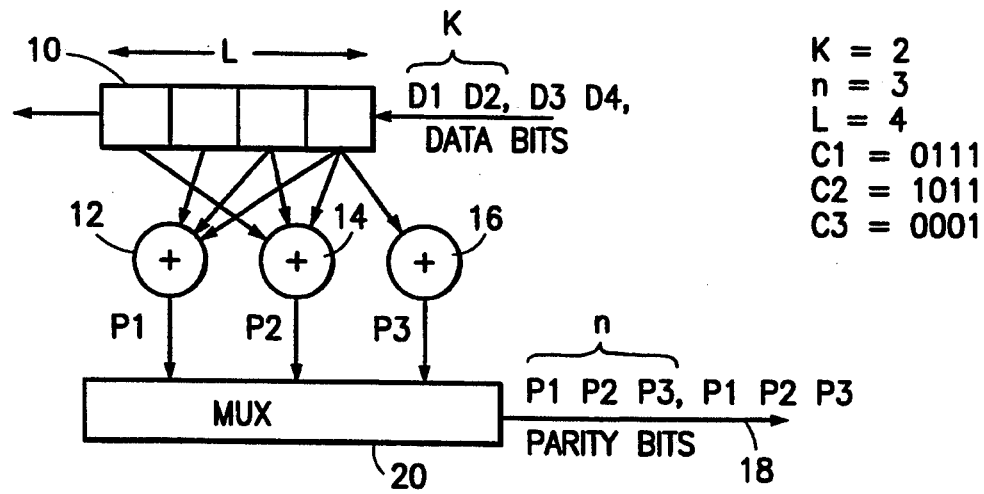
FIG. 2
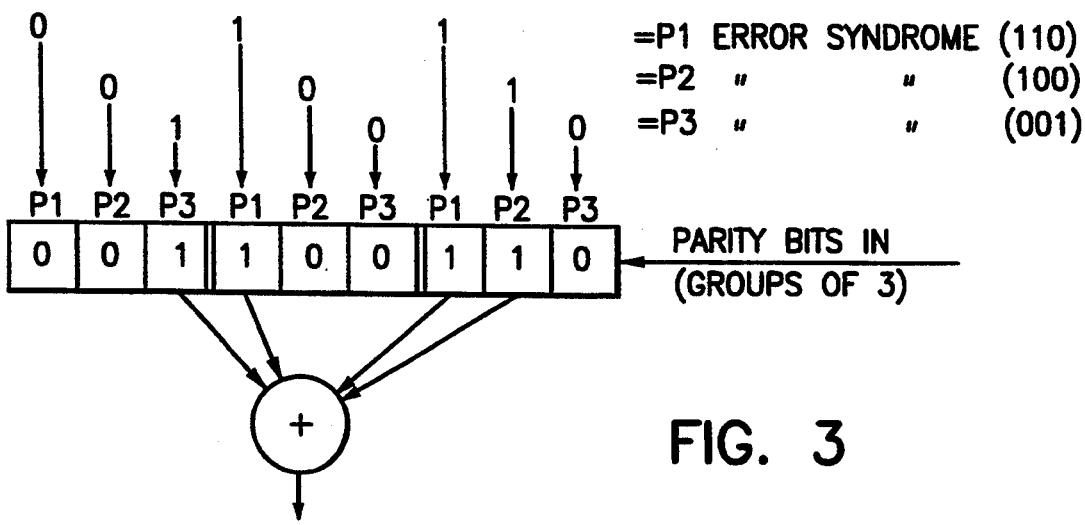
FIG. 3

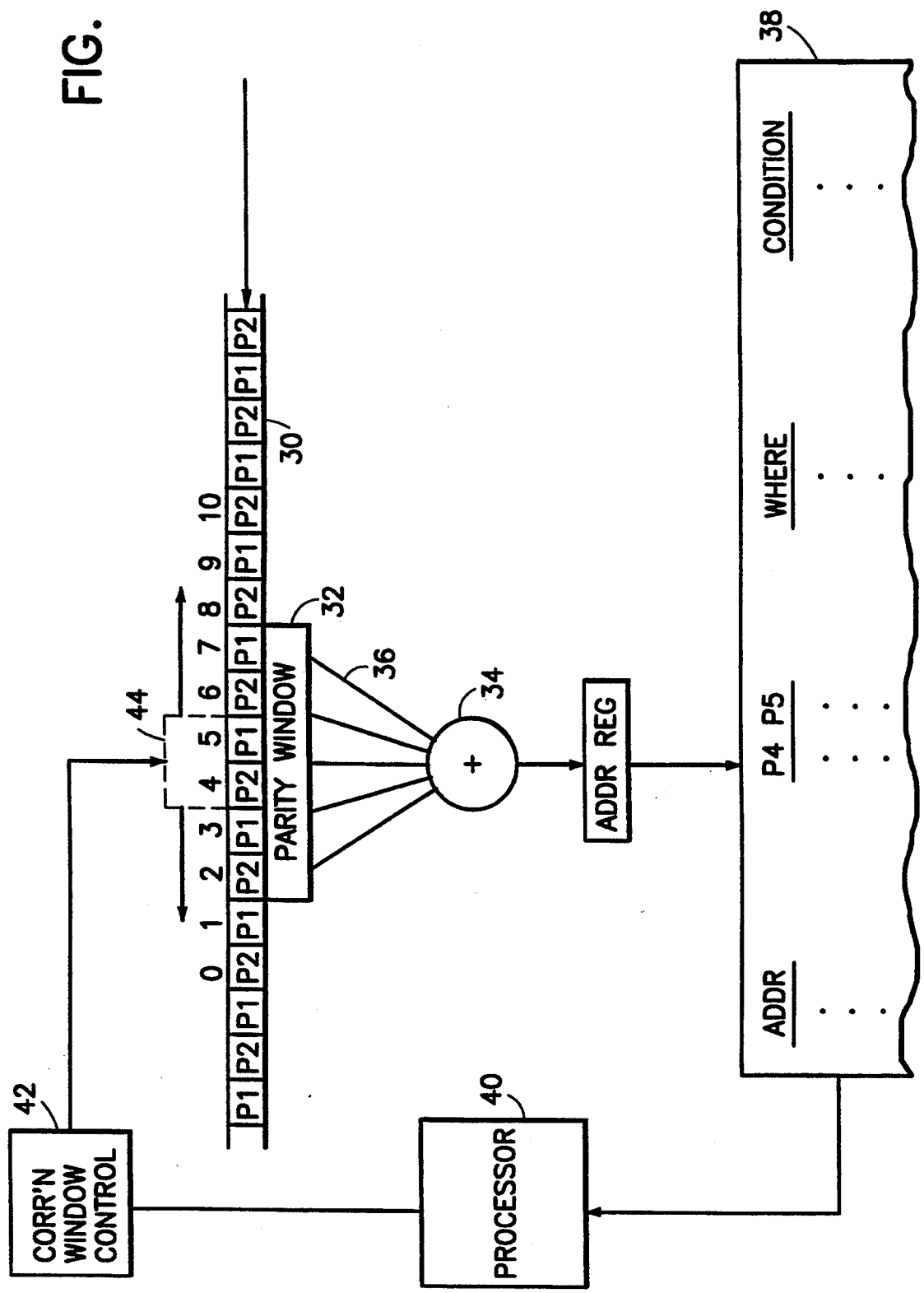

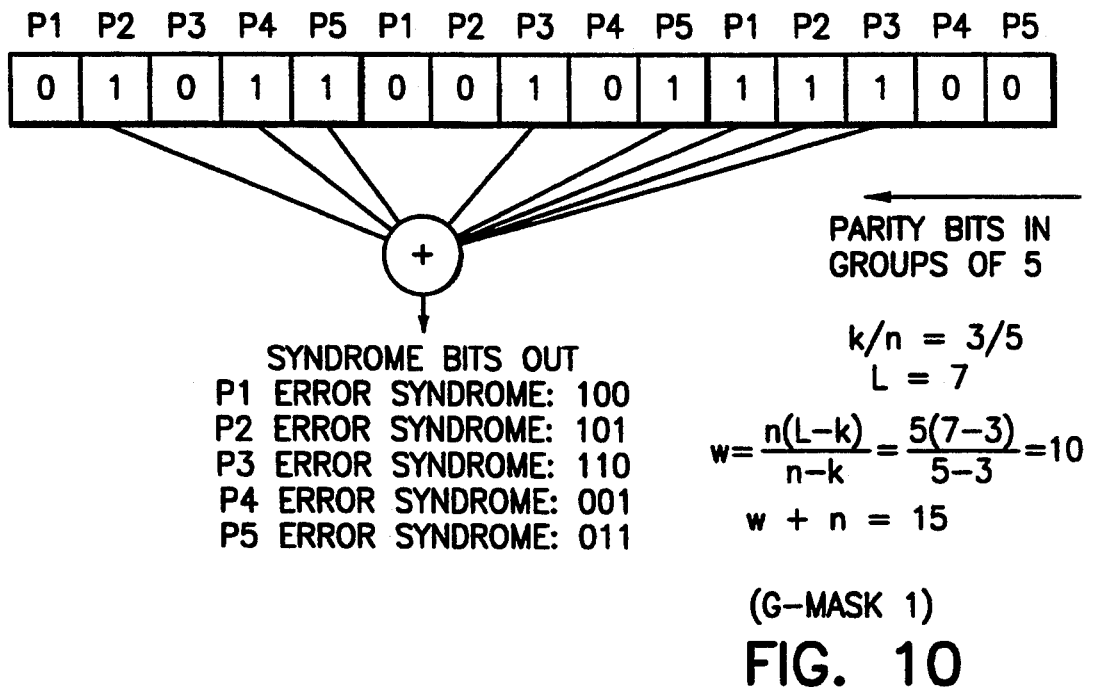
FIG. 10 (G-MASK 1)
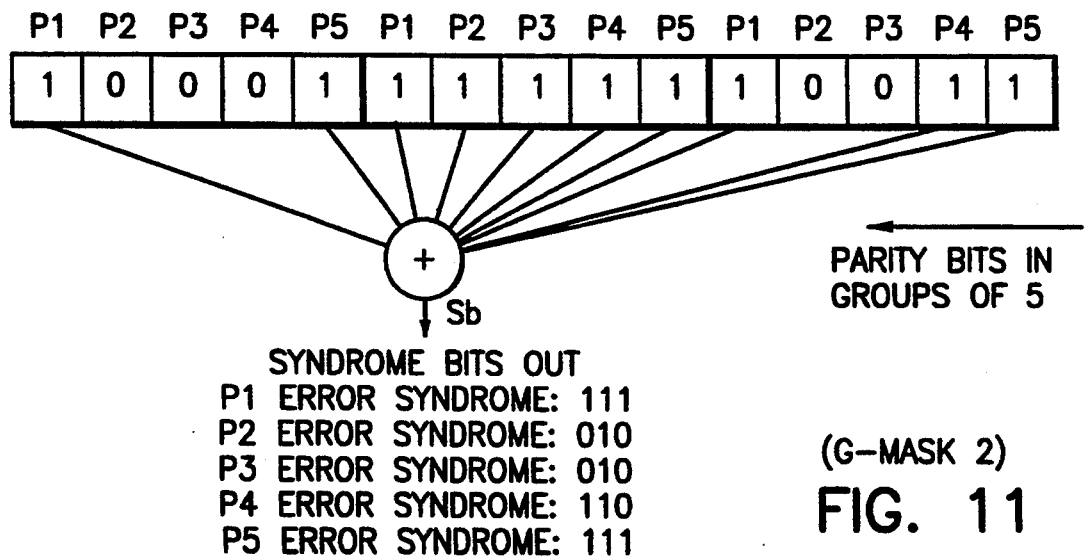
FIG. 11 (G-MASK 2)
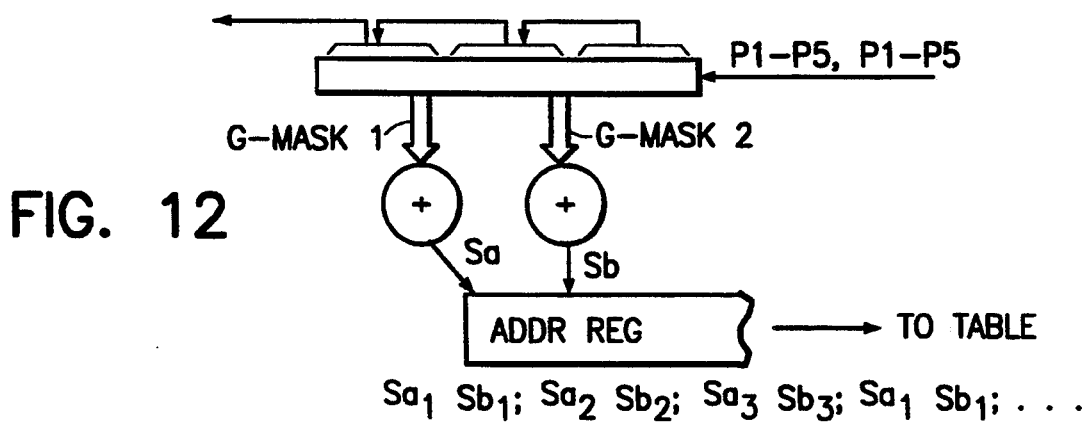
FIG. 12

SYSTEM FOR ENCODING AND DECODING OF CONVOLUTIONALLY ENCODED DATA

FIELD OF THE INVENTION

This invention relates to digital decoding methods and systems and, more particularly, to methods and systems for decoding and error correcting convolutionally encoded digital data.

BACKGROUND OF THE INVENTION

To convolutionally encode a digital data stream in the manner taught by the prior art, n code words of length L (called the constraint length) are employed as a mask. For each mask, the bits of the data stream that appear through the mask are Exclusive OR'd to obtain one parity bit for each mask from the L length of data bits, a total of n parity bits. The bit stream is then moved by k bit position with respect to the mask, and the process is repeated. This results in the generation of another set of n parity bits which includes information from the new L data bits.

If two different code words are used as masks, then two bits of parity information result for every data bit. The ratio of the number of original data bits to the number of replacement parity bits is called the coding rate. Thus, where one data bit is replaced by two parity bits, the coding rate is one half.

As will be understood, Exclusive-OR or modulo 2 sum logical operations are vital to the functioning of convolutional encoders and decoders. Furthermore, it is vital in parity encoding a data stream, that the encoded sequence of parity bits uniquely represents a sequence of data bits. In U.S. Pat. No. 5,077,743 to Bitzer et al., a system is described for decoding a convolutionally encoded data stream that has been encoded at a one half rate. The disclosure of the Bitzer patent is incorporated herein by reference. Bitzer et al. determined that for a constraint length L, code words could be chosen such that a data word of length D would have a unique relationship to a series of parity bits where the following equation was satisfied:

$$D = 2(L-1)$$

Thus, where the length L of a code word is three bits, a convolutional encoding technique can generate two pair of parity bits uniquely related to a four bit data word. As shown by Bitzer et al., for each of sixteen values of 4 bits of data (i.e., 0000-1111), a unique 4 bit parity relationship exists. It can thus be understood that identical mathematical operations may be carried out with respect to corresponding parity and data bit groups, while still maintaining the unique one to one relationship.

It was also shown that the $2^{2(L-1)}$ unique relationships between parity and data could be reduced to $2(L`1)$ relationships, from which the remaining ones could be derived through Exclusive OR functions. Given these unique relationships and an uncorrupted run of parity bits, a decoder could readily reconstruct the data bits from which the parity bits had been originally derived. In FIG. 1, an example is shown of how a sequence of uncorrupted parity bits can be decoded, independent of the data that gave rise to the parity bits. A run of data bits, shown on the top line of FIG. 1 is converted to a run of parity bits P1P2, utilizing a half rate convolutional encoding circuit. It will be noted, that all parity bits are uncorrupted and for half rate encoding two parity bits are generated for each data bit, so that as each data bit moves out of an encoding shift register, two parity bits are transmitted. At the receiving end of a communication link, each time two parity bits are received, a single data bit has been cycled through the encoding shift register. At time T0, two parity pairs, 10 00 are in the decoding register. At time T1, an additional parity pair is received and shifted into the decoding register, etc. On the right side of FIG. 1, each parity pair has been converted to its corresponding data bit sequence, using a conversion table that includes the unique data/parity relations.

By examining the aligned vertical columns of data bits, an important relationship was discerned. In specific, when uncorrupted parity bit pairs were received, the columns of overlapping, derived data expressions were identical. Thus, as each column of data bits was examined, completely identical bits were resident therein. This relationship existed no matter what the data was and thus was totally independent of the data. Thus, if two successive overlapping columns of data bits were Exclusive OR'd together, the result was always zero. Only when there was a parity error, was the zero Exclusive OR relationship not true.

When parity errors occurred in the received parity stream, Bitzer et al. found that the Exclusive OR relationship between overlapping bits in each column of succeeding data bit groups was either zero or a fixed number (N), which number N was dependent only on the code words used to encode the data stream. Thus, as the parity bit stream slid by, two bits at a time, the Exclusive OR differences between successive columnar sets of overlapping data bits produced unique patterns of zeros or ones for any single corrupted parity bit. Also, for any combination of corrupted parity bits, the Exclusive OR operation yielded a unique pattern of zeros and ones, which pattern was the reverse of the code word used to generate the accompanying parity bit position. That unique pattern was thus used to address a correction table that produced bits used to correct the corrupted parity.

Those skilled in the art will realize that the relationships set out in the Bitzer et al. patent established the basis for decoding half rate convolutionally encoded parity streams. That encoding technique was directly dependent upon unique $2(L-1)$ bit parity to data (and vice versa) relationships. However, for other coding rates, it was then not known how to establish the required unique parity to data relationship to match an encoding rate of other than one half and a chosen constraint length.

Accordingly, it is an object of the present invention to provide a convolutional encoding/decoding method and apparatus for encoding rates other than one half.

It is a further object of this invention to provide a convolutional decoding method and apparatus which exhibits improved decoding capability.

It is another object of this invention to provide a convolutional decoding method and apparatus which is capable of decoding actions in the presence of parity errors that give rise to ambiguous correction results.

It is still another object of this invention to provide a convolutional decoding method and apparatus wherein error correction is enabled by tables that store correction values, the tables enabling reconstruction of lost groups of data.

SUMMARY OF THE INVENTION

A convolutional encoding/decoding system encodes a data bit stream into n bit parity sets from k bit data bit sets, using code words of length L. The system is dependent upon the finding that unique data to parity tables can be generated where both data and parity bit blocks are w bits in length. The value of $w=n(L-k)/(n-k)$. An encoded parity bit stream is subjected to Exclusive OR operation through a connection mask or masks that are dependent upon the encoding code words. The Exclusive OR operation generates syndrome symbols indicative of the presence of errors in the parity bit stream and which are employed to address a correction table. Parity correction values are derived from the correction table and are used to revise the parity bit stream, which is then decoded, using a parity to data table. A number of parity correction procedures are disclosed.

DESCRIPTION OF THE DRAWINGS

FIG. 1 illustrates a parity bit stream for a ½ rate encoded data stream and the unique relationships between parity and data bit groups.

FIG. 2 is a block diagram for a convolutional encoder used to implement a ⅔ encoding rate.

FIG. 3 shows a mask for enabling an Exclusive OR circuit to directly generate error syndrome symbols from a received parity bit stream.

FIG. 5 is a block diagram of a parity error detection/-connection circuit useful for correcting parity errors that have already passed through a correction window.

FIGS. 10 and 11 show masks for a 3/5 rate convolutional code.

FIG. 12 is a block diagram showing use of the masks of FIGS. 10 and 11 in a convolutional decoder.

DETAILED DESCRIPTION OF THE INVENTION

Introduction

Figure 4:
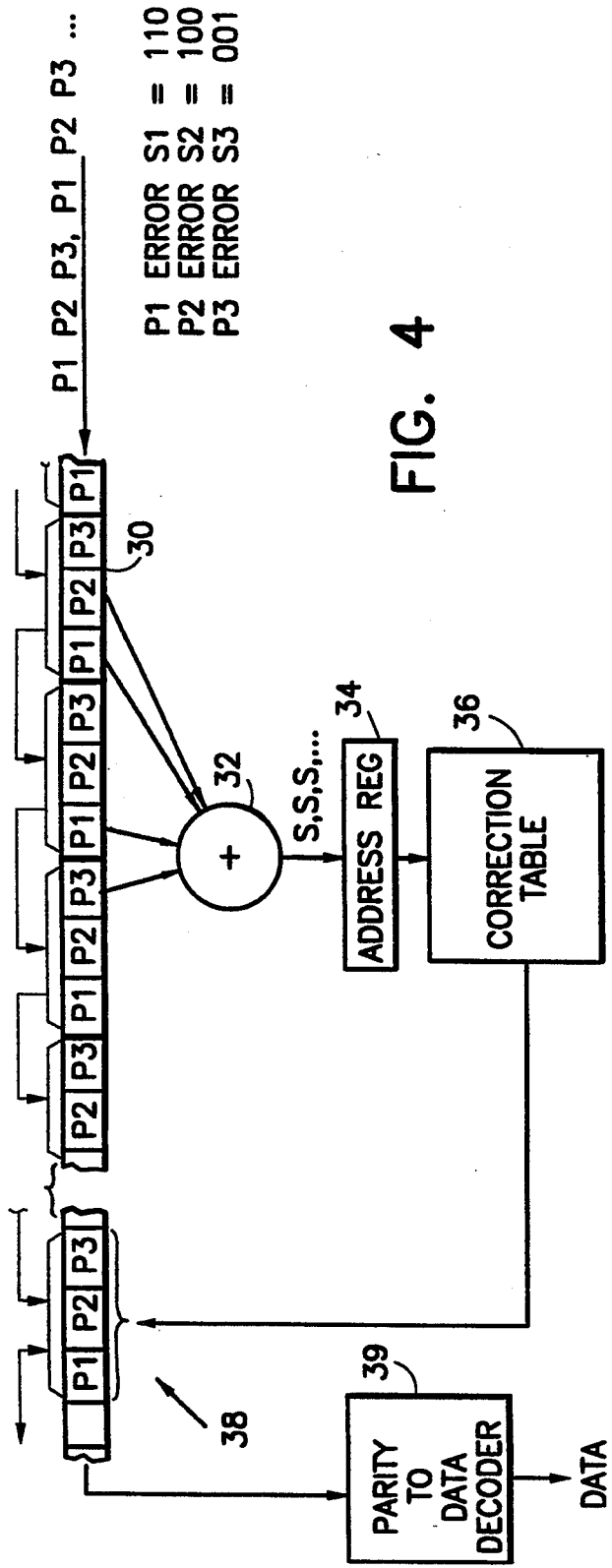
FIG. 4 is a block diagram of a parity error detection and correction circuit for a ⅔ encoding rate.

Encoding and decoding is based on existence of a one-to-one relationship between a block of data bits in a data stream and a block of parity bits in a parity stream. Error detection and correction is accomplished via an Exclusive OR function that generates a syndrome vector independent of the data. An all-zero syndrome vector corresponds to no errors. A non-zero syndrome vector indicating errors is used as an address into a table which contains information necessary to correct the parity stream. Alternatively it can be used as the seed for a process that will generate corrections in the presence of hidden errors. The table-based correction and decoding system can be used to reconstruct data in transmissions where whole cells (or blocks) of contiguous parity bits are lost.

1.1 Encoding

As indicated above, a table-driven encoding process for a ½-rate convolutional code was described in the Bitzer et al. patent.

In general, for a coding rate k/n, each encoding cycle processes k data bits and produces n parity bits. The encoding is accomplished using n encoding masks (or codes) of length L. In each encoding cycle, each new parity bit includes information from L data bits.

In FIG. 2 a circuit is shown for producing a convolutionally encoded parity stream exhibiting three parity bits (n=3) for every two data bits (k=2) input to the circuit. The code length is 4 and the code words are: C1=0111, C2=1011 and C3=0001. Data bits D1, D2, . . . are shifted into and out of shift register 10, two bits at a time. The three codes C1–C3 are implemented as "masks" that comprise lines to Exclusive OR circuits 12, 14 and 16. The connecting lines from shift register 10 to each Exclusive OR circuit are defined by a code word. Thus, for C1=0111, lines connect the first three stages of register 10 to Exclusive OR 12. For C2=1011, lines from the first, second and fourth stages connect to Exclusive OR 14, etc. As a result of these "masks" Exclusive OR's 12, 14, 16 generate three parity bits P1, P2, P3 each time two new data bits are shifted into register 10. Those parity bits are multiplexed onto output line 18 by multiplexer 20.

2. One-to-One Mapping

Fundamental to the table-driven decoding methods of this invention is the existence of one-to-one correspondence between sets of data bits and sets of parity bits. If it exists, one-to-one correspondence requires that a block of data bits uniquely correspond to a block of parity bits, both blocks having identical bit lengths. Let this length be defined as w. It has now been determined how to compute a smallest value of w for an encoding register of size L and a coding rate k/n, where n is greater than two. For the one half coding rate (k/n=½), Bitzer et al. found that $w=2(L-1)$.

Consider a coding rate k/n, with a code length L. There are n masks wired to the same L memory cells that comprise the encoding register. L must be bigger than k. Table 2.1 details the correspondence between data bits and parity bits and the computation of w. In the 0th iteration, n masks generate n parity bits from the first L data bits. On next iteration, k additional data bits are shifted into the encoding register, and k "oldest" bits are discarded. This results in n more parity bits. The process proceeds in this manner. In general, after the ith iteration, (i+1)n parity bits have been produced by L+ik data bits.

TABLE 2.1

| One-to-One Mapping, k/n-rate, length = L | | |
|---|---|---|
| Iteration | No. of Data Bits | No. of Parity Bits |
| 0 | L | n |
| 1 | L + k | 2n |
| 2 | L + 2k | 3n |
| . | . | . |
| . | . | . |

TABLE 2.1-continued

| One-to-One Mapping, k/n-rate, length = L | | |
|---|---|---|
| Iteration | No. of Data Bits | No. of Parity Bits |
| ⋮ | ⋮ | ⋮ |
| i | L + ik | (i + 1)n |

Let i be the iteration where the number of data bits equals the number of parity bits, i.e. corresponding blocks are equal in size. That is, $L+ik=(i+1)n$ holds true and, therefore, $i=(L-n)/(n-k)$. Substituting this value of i into $L+ik$, (A) $w=n(L-k)/(n-k)$ is found to be the smallest block length that satisfies the one-to-one correspondence condition.

Equation A, as will be seen hereafter, defines the minimum block length where parity to data correspondence is present, given a coding rate k/n and constraint length L. Where $k/n=\frac{1}{2}$ and $L=3$, the equation degenerates to $2(L-1)=2(3-1)=4$. Thus while a special value of equation A was heretofore known by Bitzer et al., the full equation for deriving w was not known and could not be extrapolated from the one half coding rate, as the denominator equalled one and was hidden. Knowing how to properly derive the value of w is critical to this invention.

2.1 Table-Based Encoding

An encoder can be constructed using the above knowledge by specifying an encoding table which contains a unique w-bit parity block for each unique w-bit data block. The size of this table is $2^w$ for binary data, since a w-bit block can take on $2^w$ values. However, the table can be reduced in size. A reduced table contains only w elements, each one of which is w bits wide and has a single 1 in a position different from any other element, with the rest of its bits being zero. If the mask codes are appropriate, elements of a reduced table can be combined using modulo 2 arithmetic to produce any needed combination of data or parity patterns, w bits long.

As an example, consider a ⅔-rate code with $L=4$. Let $C1=0111$, $C2=1011$, and $C3=0001$ be the encoding masks. The one-to-one mapping length is $w=6$. This means that 6-bit blocks of data bits should correspond uniquely to 6-bit blocks of parity bits. In general, there will be $2^w$ entries in a full table, but the reduced encoding table shown in Table 2.2 requires only w entries.

TABLE 2.2

| Reduce Encoding Table | |
|---|---|
| Data Bits | Parity Bits |
| <------direction of data/parity flow------ | |
| 100000 | 010000 |
| 010000 | 100000 |
| 001000 | 110010 |
| 000100 | 111100 |
| 000010 | 000110 |
| 000001 | 000111 |

In general, this invention employs an encoding window (e.g. shift register) w data bits wide. Those w data bits are processed as a block into w parity bits using the encoding table. Then k new data bits are shifted into the encoding window (or register) and another block of w parity bits are produced. The new parity block overlaps the end of the previous parity block by its first w–n parity bits. The overlapping parity bits are identical.

The process repeats until all data bits have been mapped. It is important to note that while the data stream moves k bits at a time, only n new parity bits are produced for each block of w parity bits obtained from the encoding table. It is also important to note that proper selection of the code words enables the creation of the above-described decoding/encoding tables. Code word selection is discussed in section 8.

2.2 Table-Based Decoding

If the mapping is unique, then each w-bit block of parity bits can be decoded into a corresponding w-bit data block. This is accomplished through generation of a decoding table in which parity bit blocks are fully independent and mutually unique, i.e., there are w unique data elements, each one of which is w bits wide, and each one corresponds to a parity element which has a single 1 in a position different from any other element, while the rest of its bits are zero. The Bitzer et al. patent describes the process of construction of a decoding table for a rate of ½ and a code length of L. The principle remains the same in the case of k/n coding. It is essential that such a decoding table be constructed for a parity stream to be uniquely decoded. The decoding table for the ⅔ rate example is shown in Table 2.3.

TABLE 2.3

| Reduced Decoding Table | |
|---|---|
| Parity Bits | Data Bits |
| <------direction of parity/data flow------ | |
| 100000 | 010000 |
| 010000 | 100000 |
| 001000 | 001110 |
| 000100 | 111010 |
| 000010 | 111000 |
| 000001 | 000011 |

Given that there are no errors in the parity stream, the decoding process becomes one of applying an exact reverse of the encoding process, i.e. a block of w parity bits is mapped into w data bits, using the decoding table. After each block is produced, another n parity bits are moved into the decoding window. The first w–k bits of the new data block will overlap the last w–k bits of the previous data block. If there are no errors in the parity stream, the overlapping bits will match exactly, i.e. bit by bit Exclusive-OR of the overlapping sections will be zero.

However, if errors are present in the parity stream the overlapping sections will not match and can produce non-zero values when Exclusive-OR'd. It has been determined that the number of different values that are produced that way is $2^{n-k}$. These difference values are hereafter called syndrome symbols. A series of these symbols is a syndrome vector. The syndrome vector is zero if there are no errors in the parity stream. A symbol representation one bit long can be used in $(n-1)/n$ coding rates. In such a case, a zero (0) is assigned to an exact match between the overlaps, and a one (1) is assigned if there is a difference. The number of syndrome symbols in a syndrome vector is the same as the number of overlap differences used in determining that vector. The sequence of zeros and ones that comprise a syndrome vector can be formed into an address that can locate stored information concerning how to correct the error that generated the syndrome vector.

If a coding rate of k/n is employed where $(n-k)>1$, (e.g., a coding rate of 3/5) the symbols generated by each Exclusive OR difference, (when there is an error in the parity) can be one of 4 distinct values. Two bits then need to be used to record the syndrome symbols. A 3/5 coding example appears in Section 9.

3. Error Detection

Errors in the parity stream are detected using the syndrome vector. Although the syndrome vector can be generated either through repeated application of a decoding table, a more efficient way is through the use of a mask (hereafter called g-mask). The g-mask specifies interconnections between shift register stages and an Exclusive-OR circuit for a given code rate and length. The g-mask is derived from the code words, and the length of the g-mask is determined by the code rate and code length L as follows:

$$\text{g-mask length is } n\left(\frac{L-k}{n-k} + 1\right) = w + n$$

The process of g-mask generation is hereafter illustrated using a ⅔-rate code, with L=4, C1=0111, C2=1011, and C3=0001 as the encoding masks. The one-to-one mapping length for a ⅔-rate code with L=4 is w=6. This means that 6-bit blocks of data bits correspond uniquely to 6-bit blocks of parity bits.

At the receiver, a parity stream for ⅔ coding i.e. k=2 and n=3, is processed in 3-bit blocks. The g-mask is generated by considering parity streams with single-bit errors in each of the positions in the three bit parity block. Those are denoted by P1, P2, and P3.

Assuming the data are all zeros, consider an error in the position P1 of the third block of the following parity stream, which is moving from right to left, i.e., 000 000 100 000 000. Assume that the decoding window (w=6 bits wide) is positioned on the leftmost side of the shown stream segment (underlined). The leftmost 6-bits of the stream map into the following data bits: 00 00 00. The parity stream next moves by three bits so the next 6-bit block in the window is 100 000. The corresponding data block is 11 10 10 (see table 2.3 above). Moving the parity stream by 3 more bits results in 100 000 as the parity block, and 01 00 00 as the corresponding data block. Finally, the parity block 000 000 decodes into 00 00 00.

The overlaps between successive parity and data blocks are illustrated in table 3.1 below. Note that because of the parity error, the differences between successive data blocks generated around the error are not zero. In fact, a three-bit block with an error in the P1 bit took two three-bit shifts to move through the 6-bit decoding window and the block with the error in it contributed to three differences (or syndrome symbols) before it moved out of the width of the mapping table.

TABLE 3.1

Rate = 2/3, L=4
<------direction of parity/data flow------
000000000100000000

| PARITY | DATA | XOR DIFFERENCE | SYNDROME BIT FOR ERROR IN P1 | |
|---|---|---|---|---|
| 000000 | 000000 | | | |
| 000000 | 000000 | 0000 | i−1 | 0 |

TABLE 3.1-continued

Rate = 2/3, L=4
<------direction of parity/data flow------
000000000100000000

| PARITY | DATA | XOR DIFFERENCE | SYNDROME BIT FOR ERROR IN P1 | |
|---|---|---|---|---|
| 000100 | 111010 | 1110 | i | 1 |
| 100000 | 010000 | 1110 | i+1 | 1 |
| 000000 | 000000 | 0000 | i+2 | 0 |

The overlap between the 6-bit data blocks is 4 bits long. The overlapping bits (underlined) are exclusive OR'd and the result of the operation is either an all-zero sequence or a fixed binary number 1110. This non-zero binary number depends on the encoding masks and the code length. Because the difference between the denominator (n) and the numerator (k) is 1 for ⅔ coding, the two values that the exclusive OR sum can take require one bit to represent. The all-zero sum is represented by a single 0 and the non-zero binary number with a 1, each of these values being a syndrome symbol. The resulting sequence of overlaps produces a sequence of these symbols which then makes up the syndrome vector.

The characteristic syndrome vector in the example is 110 where the first two 1's denote the first two generated syndrome symbols.

In a similar manner, syndrome symbols for errors in positions P2 and P3 can be generated. The syndrome vector for a P2 error is 100 and for a P3 error 001.

3.2 g-mask

The g-mask can now be derived using the three syndrome vectors generated in the aforementioned fashion. The three characteristic syndrome vectors can be interleaved in a number of ways, provided that it corresponds to the order in which the parity bits are generated. In the example they are interleaved as shown in FIG. 3.

The g-mask pattern in FIG. 3 and represents the wiring connection to an Exclusive OR circuit to enable syndrome generation that is is used to detect errors in the parity stream.

Once the g-mask is known for a code, the receiver can use it to calculate the syndrome vector. FIG. 3 shows the syndrome generation process for a ⅔-rate code with L-4, wherein the g-mask=001100110. Note that the 1's in the g-mask indicate the shift register stages that get connected to the Exclusive OR adder. The received data stream is shifted in 3 bits at a time. The output of the Exclusive OR circuit, upon each shift, is a syndrome bit. A quick test will indicate that parity streams with one bit errors in the P1, P2 and P3 positions, respectively, (i.e., 000100000, 000010000, 000001000) produce syndrome vectors 110, 100, 001, respectively.

The syndrome vector so generated is used as an address to access a table which indicates which of the parity bits is in error. The correction table provides information to be used by a correction register for correcting the parity stream. A correction for the example code is applied to 3 bits because there are 3 distinct parity bits in each parity block.

4. Correction of a Parity Stream

4.1 The Process of Correcting Erroneous Parity Bits Employs Table Look-Up

One or more tables are generated to apply the corrections. Since the method of error detection (syndrome generation) and parity stream correction is data independent, it is not necessary to show parity bits that belong to uncorrupted data, but only the parity bits which when Exclusive-OR-ed with the uncorrupted parity stream yield the corrupted stream. For example, suppose that in the parity stream 00110100110101101, the 7th bit from the left is in error. This parity stream can be decomposed, using Exclusive-OR, into an uncorrupted stream and an error stream as follows:

| | |
|---|---|
| 00110110110101101 | uncorrupted parity stream is XOR-ed with an |
| 00000010000000000 | error vector S to give |
| 00110100110101101 | corrupted parity stream S' |

As above indicated, the syndrome for an uncorrupted parity stream is zero. Exclusive-OR of the uncorrupted parity stream (syndrome vector of zero) and the error (syndrome vector S), yields the corrupted parity stream (syndrome vector S'). Exclusive-OR is the operation which, through the application of the g-mask, transforms the parity stream into the syndrome stream. Hence, S'=S+Zero, and the syndrome for the corrupted parity stream is the same as that of the error vector. Therefore, to facilitate visualization of the process, all examples where error correction need to be applied will show error vectors only.

Also, to facilitate explanations an example based on half-rate coding is used but it should be understood that the principle extends to any coding rate, k/n.

4.2 General Process

In the parity stream a set of correction points are chosen that contain at least n parity bits. Usually those bits are contiguous and are blocked into a so-called "correction window". The bits in the window are the ones to which corrections will be applied. The optimal position of the correction window within a parity stream block (i.e., in the block that generated a syndrome address) will depend on the correction method employed. The syndrome address is used to access a table that contains information indicating which, if any, parity bits in the correction window need to be corrected. The correction information from the table is applied to the parity stream according to a correction algorithm, and the process is repeated.

In FIG. 4, an exemplary decoding system is shown for a ⅔ rate convolutionally encoded parity bit stream. Shift register 30 and Exclusive OR circuit 32 are the same as shown in FIG. 3. A series of syndrome values S (or "symbols") are generated, one for each shift of three parity bits into shift register 30. As above indicated, the g-mask connections to Exclusive OR 32 forces a syndrome symbol to be a 1 bit if there is a parity error and to be a 0 bit if there is none. A series of the syndrome symbols (syndrome vector) is loaded into address register 34 and serves to access a position in table 36 that includes appropriate correction bits. Those correction bits are then applied as correction values to a correction window 38. Correction window 32 may be located either within shift register 30 or later in the parity stream.

Figure 4A:
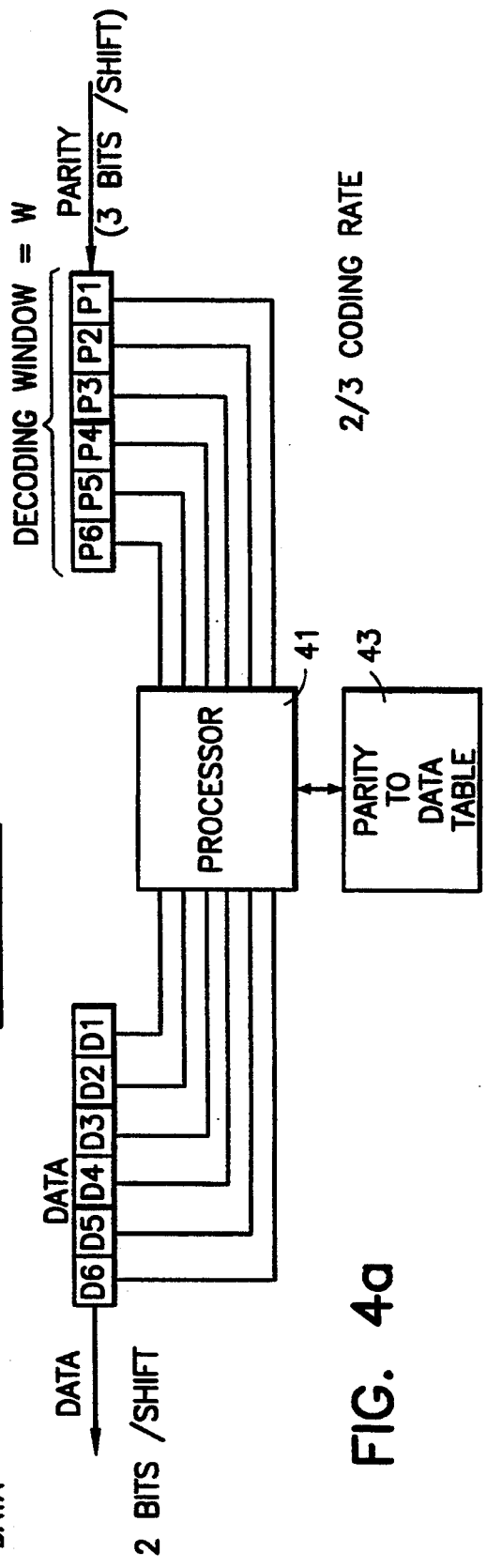
FIG. 4a is a block diagram of the parity to data decoder shown in FIG. 4.

Once the corrected parity bits exit from correction window 38, they are converted to data in parity to data decoder 39. A more detailed block diagram of decoder 39 is shown in FIG. 4a wherein incoming parity bit blocks (of total length w) are converted to outgoing parity blocks (of total length w). The conversion occurs when processor 41, upon receiving a block of parity bits, accesses the corresponding w-length set of data parity bits from table 43 and places them in an outgoing data register.

4.3. Correction Method I: The Full Parity-Width Process

The following procedure is called a full-width process because it considers the possibility of an error in the parity stream on both sides of the correction window. In this case, the correction window is centered in the parity bit stream sample. Correction tables are generated by simulating all possible error combinations that the table is to handle, recording their syndrome addresses, and bits that need to be corrected within the correction window. The example that follows illustrates the process.

The following example is for ½ rate coding and two L=3 codes, $C_1=011$ and $C_2=111$. The width of the one-to-one mapping table is 4, and the g-mask length is 6 and equal to 101111 for the parity stream moving from right to left.

4.3.1 Table Generation and Use

Assume the correction window is situated in the middle of the parity window that is required to generate S=3 syndrome bits, i.e. correction points are bits 5 and 6 counting from the left. Uncorrupted parity, in a parity window of length 10 bits, will generate three syndrome bits with value zero as it moves through the g-mask. (Rather than showing movement of the parity stream, moving to the left, the g mask is shown moving to the right for ease of illustration purposes.)

| p1 | p2 | p3 | p4 | p5 | p6 | p7 | p8 | p9 | p10 | Parity Stream |
|---|---|---|---|---|---|---|---|---|---|---|
| 0 | 0 | 0 | 0 | 0 | 0 | 0 | 0 | 0 | 0 | <---- direction of parity flow |
| 1 | 0 | 1 | 1 | 1 | 1 |   |   |   |   | gives syndrome bit 0 |
|   | 1 | 0 | 1 | 1 | 1 | 1 |   |   |   | gives syndrome bit 0 |
|   |   | 1 | 0 | 1 | 1 | 1 | 1 |   |   | gives syndrome bit 0 |

As shown above, since there are no corrupted bits in the correction window, a correction table entry with address 000 (binary 0) will contain two entries, 0 and 0, as shown in Table 4.1 below, indicating that no correction is necessary. In fact, if the syndrome, is zero, table look-up, is not performed and the next 2(in general n) parity bits are shifted into the g-mask register.

Now assume that an error appears in parity position p10. Since error detection is data independent, only the corrupted bit need be shown in the bit stream. Remember syndrome bit computation involves an AND operation between the parity and the g-mask followed by exclusive OR of the bits obtained after the AND operation (i.e. exclusive OR of the unmasked bits, or bits matching 1 of the mask).

```
p1 p2 p3 p4 p5 p6 p7 p8 p9 p10    Parity Stream
 0  0  0  0  0  0  0  0  0  1  <--- direction of parity flow
 1  0  1  1  1  1                   gives syndrome bit 0
       1  0  1  1  1  1             gives syndrome bit 0
             1  0  1  1  1  1       gives syndrome bit 1
```

The syndrome address is now 001, but that there is no need to apply correction to bits p5 and p6. The correction table entries at 001 (decimal 1) are still 0 and 0.

The next two bit parity block is shifted in and only the one error is present, a 011 syndrome is generated.

```
p1 p2 p3 p4 p5 p6 p7 p8 p9 p10    Parity Stream
 0  0  0  0  0  0  0  1  0  0  <--- direction of parity flow
 1  0  1  1  1  1                   gives syndrome bit 0
       1  0  1  1  1  1             gives syndrome bit 1
             1  0  1  1  1  1       gives syndrome bit 1
```

While the syndrome address is now 011, there is still no need to apply any correction to bits p5 and p6. The correction table entries at address 011 are still 0 and 0. Shifting in the next two bit parity block and assuming that there still is only this one error, the following results:

```
p1 p2 p3 p4 p5 p6 p7 p8 p9 p10    Parity Stream
 0  0  0  0  0  1  0  0  0  0  <--- direction of parity flow
 1  0  1  1  1  1                   gives syndrome bit 1
       1  0  1  1  1  1             gives syndrome bit 1
             1  0  1  1  1  1       gives syndrome bit 0
```

Now the syndrome address is 110, and there is need to apply correction to bit p6 but not to bit p5. The correction table entries at address 110 are 0 and 1.

Similar computations can be made with an error in places p9, p7, p5, p3 or p1. They all represent a one-bit error in the parity window. The process can be repeated for all two, three or more bit error combinations over all the 10 parity window bits. Each time, an entry is made in the correction table to denote which, if any, of the correction point bits needs to be corrected.

Table 4.1 below shows entries that would be made if only one-bit errors were allowed in the parity stream window. Some of the entries in table 4.1 will be empty (x) because one bit errors do not generate these addresses. Those that have zero in the correction window will have a 0 in the table, and those that have a one will have 1 in the table. In one case (table address 110), a double entry 1/0 for P6 indicates a conflict.

TABLE 4.1

Correction table based on a 3 bit syndrome address.

| Address | P5 | P6 |
|---------|----|----|
| 000 | 0 | 0 |
| 001 | 0 | 0 |
| 010 | x | x |
| 011 | 0 | 0 |
| 100 | 0 | 0 |
| 101 | x | x |
| 110 | 0 | 1/0 <-- Conflict |
| 111 | 1 | 0 |

4.3.3 Table Conflicts

For a given parity window and syndrome address size, it is possible that when a new entry is made, the address has already been used and contains entries which conflict with an attempted new entry. This can lead to an ambiguous determination of the correctness of the parity bit stream. For example, the following error pattern conflicts in its correction requirements with the one already entered for syndrome address 110.

```
p1 p2 p3 p4 p5 p6 p7 p8 p9 p10    Parity Stream
 0  0  1  0  0  0  0  0  0  0  <--- direction of parity flow
 1  0  1  1  1  1                   gives syndrome bit 1
       1  0  1  1  1  1             gives syndrome bit 1
             1  0  1  1  1  1       gives syndrome bit 0
```

From table 4.1, it can be seen that at address 110, a previously considered one-bit pattern requires correction of p6. The current one does not. This conflict is denoted in Table 4.1 as entry 1/0 for bit p6. These two entries compete with each other and need to be resolved before the table can guarantee that there will be no mis-correction.

When creating correction tables, syndrome bit patterns are generated starting with a most likely combination of errors. At low error rates this is usually single bit errors, followed by two bit errors, etc. At higher error rates the sequence may start with some other error combination. The syndrome bit sequence is then used as an address into a table. As seen in table 4.1, the content of the table is zero if the pattern does not have an error in the bit location for which the table is constructed, and a one if it does. In the method described here, there are many more zeros than ones in such a table. If there were no limits on the size of the table, the number of syndrome symbols in the address used could be as long as wished, and the error correction could be made more and more perfect.

The correction tables can be constructed to simultaneously handle as many correction points as desired so long as the number does not exceed the width of the parity window. Furthermore, the correction points do not have to be contiguous.

Once the correction tables have been built, correction of the encoded bits occurs by forming the syndrome address from generated syndrome symbols, accessing the table if the syndrome address is different from zero, and determining if the particular bits in the correction positions should be changed. The correction may be applied immediately, or with a delay pending confirmation of the change in a future correction cycle. When feedback is employed (i.e. both the parity and the syndrome bits are modified to reflect the applied corrections), then once the correction has been applied, the syndrome vectors are recomputed (or adjusted) to take the correction into account.

4.3.4 Resolution of Table Conflicts by Syndrome Address Extension

Table entry conflicts may be reduced by monitoring a wider parity stream window. In this way an error generates more syndrome symbols as it moves through the parity window and this can remove conflicting correction requests. In the example, this can be achieved by generating S=4 long syndrome addresses instead of S=3 long addresses. For instance,

```
pc pb pa p0 p1 p2 p3 p4 p5 p6 p7 p8 p9 p10       Parity Stream
    0  0  0  0  1  0  0  0  0  0  0  0       <-  direction of parity flow
    1  0  1  1  1  1                             gives syndrome bit 1
       1  0  1  1  1  1                          gives syndrome bit 1
          1  0  1  1  1  1                       gives syndrome bit 1
             1  0  1  1  1  1                    gives syndrome bit 0 pc pb pa p0 p1 p2 p3 p4 p5 p6 p7 p8 p9 p10       Parity Stream
    0  0  0  0  1  0  0  1  0  0  0  0       <-  direction of parity flow
    1  0  1  1  1  1                             gives syndrome bit 0
       1  0  1  1  1  1                          gives syndrome bit 1
          1  0  1  1  1  1                       gives syndrome bit 1
             1  0  1  1  1  1                    gives syndrome bit 0
```

The four bit address for the first pattern is now 1110, and for the second it is 0110. They are different and the conflict is resolved for one bit errors. Of course, the table is now larger and contains 16 entries instead of only 8. Also the parity window wherein errors are monitored must be extended, in this case by two bits, (in general by ns where s is the number of additional syndrome bits that are generated). Furthermore, if the code length L is not appropriate or the code words are not optimal it may not be possible to compensate for address degeneracy.

When ambiguity occurs, one way to resolve it is through additional sampling of the parity stream, such as through a second or third look-up in the same table or look ups in different tables. For example, the additional look-ups may involve computation of another syndrome address now positioned around another specific (and possibly uncorrected) parity bit that normally would have been associated with one of the error patterns that resulted in the conflict. This is shown in FIG. 5 wherein a one half coding rate example is illustrated. In brief, parity pairs are shifted into shift register 30, enter parity window 32, cause the generation of syndrome symbols by Exclusive OR circuit 34 (as a result of mask interconnection 36), which in turn address correction table 38. Table 38 has a "where" field that is indicative that the corrections shown for P4 and P5 could be generated by plural syndrome addresses. In such case, the "where" column indicates where another parity error may reside that will cause the same syndrome address. The Condition field indicates that a next syndrome address, generated when the correction window is moved over the indicated parity pairs, should indicate which corrections are to be expected, given that the current corrections shown in the table are correct.

In such case, processor 40 causes correction window controller 42 to move correction window 44 (shown schematically) over the parity pair indicated by the value in the "where" field. Next, syndrome values are recalculated, and a set of condition bits are generated which, if on the next look-up are the same as the table-recommended correction bits, it is known that the new parity pair has confirmed the error and that the corrections indicated in the first access to table 38 are correct. Otherwise, the process can be iterated until the error(s) are corrected (assuming they are correctable).

To further illustrate the above, consider the following different one-and two-bit error patterns that result in conflicting correction entries. The first two patterns require no correction of bits p5 and p6, while the third one requires correction of both bits. Notice that each gives the same syndrome address.

```
p1 p2 p3 p4 p5 p6 p7 p8 p9 p10     Parity Stream
 0  0  0  0  0  0  0  0  1  0  <--- direction of parity flow
 1  0  1  1  1  1                   gives syndrome bit 0
    1  0  1  1  1  1                gives syndrome bit 0
       1  0  1  1  1  1             gives syndrome bit 1 p1 p2 p3 p4 p5 p6 p7 p8 p9 p10     Parity Stream
 0  0  0  0  0  0  0  0  0  1  <--- direction of parity flow
 1  0  1  1  1  1                   gives syndrome bit 0
    1  0  1  1  1  1                gives syndrome bit 0
       1  0  1  1  1  1             gives syndrome bit 1 p1 p2 p3 p4 p5 p6 p7 p8 p9 p10     Parity Stream
 0  0  0  0  1  1  0  0  0  0  <--- direction of parity flow
 1  0  1  1  1  1                   gives syndrome bit 0
    1  0  1  1  1  1                gives syndrome bit 0
       1  0  1  1  1  1             gives syndrome bit 1
```

When generating correction tables it is known that the difference between the patterns is in the position of the error bits. Suppose that additional information is stored in the table at address XXX and it indicates conflict, and that parity positions pA and pB need to be investigated before a correction decision is made. If the answer for pA and pB is as expected, the original correction is applied. Part of the table entry will look like this

| Address | P5 | P6 | Where | Condition |
|---------|----|----|-------|-----------|
| 000 | 0 | 0 | 000 | 00 |
| 001 | 1 | 1 | 001 | 00 |
| 011 | 0 | 0 | 000 | 00 |
| 100 | 0 | 0 | 000 | 00 |
| 110 | 0 | 1 | 100 | 00 |
| 111 | 1 | 0 | 000 | 00 |

In the table at address 001, it can be seen that p5 and p6 require changes, and the "where" field is different from zero. This indicates that the first parity pair within parity window p1–p10 needs to be re-examined, and the "Condition" entry indicates that if the result of the next table look-up is 00 then the original change recommended for p5 and p6 should be undertaken. Otherwise, no action should be taken.

Second look-up, or computation of syndrome, around p9 and p10 positions can give one of the following addresses given below. These "second look-up" addresses are used to enter the same correction table again.

Case 1

```
p5 p6 p7 p8 p9 p10 p11 p12 p13 p14
0  0  0  0  1 0   0   0   0   0   <---  direction of parity flow
1  0  1  1  1 1                         gives syndrome bit 1
      1  0  1  1 1   1                  gives syndrome bit 1
            1  0 1   1   1   1          gives syndrome bit 1
```

The "where" entry at address 111 is zero which indicates that at this address there is no conflict and that the correction (or p5 and p6) entries at this address do not have to be confirmed through another look-up but can immediately be used in making the comparison with the condition entry from the 001-look-up which initiated this second (111) look-up. Since the correction bits for address 111 (i.e., p5=1, p6=0) are different from the expected conditions bits in address 001 (i.e., 0 and 0), the change suggested by the p5 and p6 entries at address 001 should not be accepted. However, if the following is the case Case 2

```
p5 p6 p7 p8 p9 p10 p11 p12 p13 p14
1  1  0  0  0 0   0   0   0   0   <---  direction of parity flow
1  0  1  1  1 1                         gives syndrome bit 1
      1  0  1  1 1   1                  gives syndrome bit 0
            1  0 1   1   1   1          gives syndrome bit 0
``` then the table indicates that the no-conflict and no-change condition found at address 001 is satisfied. During the second look-up, the original change request which was part of the 001 look-up, is accepted and implemented.

If the following occurs:

Case 3

```
p5 p6 p7 p8 p9 p10 p11 p12 p13 p14
0  0  0  0  0 1   0   0   0   0   <---  direction of parity flow
1  0  1  1  1 1                         gives syndrome bit 1
      1  0  1  1 1   1                  gives syndrome bit 1
            1  0 1   1   1   1          gives syndrome bit 0
```

The table returns a conflict, with a change recommendation. The conflict can be resolved by effecting one more look-up around the fourth pair of the current window, or bits p7 and p8, since for address 110 the decimal value of "Where" entry is 4. This results in

```
p3 p4 p5 p6 p7 p8 p9 p10 p11 p12
0  0  0  0  0 0   1   0   0   0   <---  direction of parity flow
1  0  1  1  1 1                         gives syndrome bit 0
      1  0  1  1 1   1                  gives syndrome bit 1
            1  0 1   1   1   1          gives syndrome bit 1
```

Address 011 returns no-conflict no-change, thus it confirms the change offered in the "second look-up" and this in turn means that the original, "first look-up" change should not be applied.

In many cases it is sufficient to use only one additional look-up to resolve the overlap problem and guarantee correct decision. However, since the position of the correction bit(s) can be different for every conflict, extra storage is needed in the correction tables to indicate which of the bits should be used for additional sampling.

There are other options for resolving conflicts and setting priorities. for example, different tables could be used at different noise levels, etc.

4.4 Correction Method II: The Fractional-Parity Process

In this method it is assumed that the parity bits that have passed through the correction window have been fully corrected. As a result it is necessary to consider only parity bits on the "uncorrected" side of the correction window. This allows extension of the parity window in the direction of the "uncorrected" side while still keeping the effective syndrome address the same. In FIG. 5 correction window control 42 would then be able to move correction window 44 to the right, but not to the left. In addition, parity window 32 would also be extended to the right.

The following example illustrates the process. A pattern like the following would still have an entry in the correction table.

```
p1 p2 p3 p4 p5 p6 p7 p8 p9 p10     Parity Stream
0  0  0  0  0 1  0  0  0  0   <--- direction of parity flow
1  0  1  1  1 1                    gives syndrome bit 1
      1  0  1  1 1  1              gives syndrome bit 1
            1  0 1  1  1  1        gives syndrome bit 0
```

But a pattern like the following one would not be entered into the table since it would be assumed that the probability that an error would occur "past" the correction window would be very low.

```
p1 p2 p3 p4 p5 p6 p7 p8 p9 p10     Parity Window
0  0  1  0  0 0  0  0  0  0   <--- direction of parity flow
1  0  1  1  1 1                    gives syndrome bit 1
      1  0  1  1 1  1              gives syndrome bit 1
            1  0 1  1  1  1        gives syndrome bit 0
```

As a result some table conflicts will be removed and table entry correction decisions will be biased towards the high probability patterns on the "uncorrected" side of the correction window. A one-bit correction table for the example half-rate code would now be as follows:

TABLE 4.3

Correction table based on a 3 bit syndrome address.

| Address | P5 | P6 |
|---------|----|----|
| 000     | 0  | 0  |
| 001     | 0  | 0  |
| 010     | x  | x  |
| 011     | 0  | 0  |
| 100     | x  | x  |
| 101     | x  | x  |
| 110     | 0  | 1  |
| 111     | 1  | 0  |

Note that in Table 4.3, the conflict was resolved for address 110 and, as a result, there are more available spaces (=x) for additional correction entries (than are available in table 4.1). This improvement removes the need to have a 4 bit address generated in order to resolve the 110 address conflict as with table 4.1.

Because mis-corrections due to conflicts are possible, error propagation control is necessary. If error correction is applied immediately and the syndrome is recomputed, the leading bits of the syndrome vector can be used to check whether the correction was successful. If the recomputed syndrome vector is not zero, the correction is reversed. Otherwise, it is accepted.

Once a mis-correction is suspected, and the recomputed syndrome is different from zero, no table look-ups are made, and the next two bit block is shifted in. This process is repeated until the first zero syndrome address is encountered. It is then assumed that the error-burst that was beyond capabilities of the table has passed and the process of looking-up the table and using table entries to correct errors is resumed.

4.5 Correction Method III: Leading One Process

Correction methods described above access correction tables every time the computed syndrome vector is non-zero. This means that so long as an error is within the parity window, the correction table will have to be accessed whether the offending bits are, or are not in the correction window. For instance, from Table 4.3 above, it can be seen that the only time the corrections are actually applied in the case of one-bit errors, is when the leading bit of the syndrome address is 1. In all other cases the table access does not yield any changes. This suggests that the table only should be accessed when the leading syndrome bit is 1 since only then will the parity error actually be in the correction window. However, this changes if two or three bit error patterns are considered. Any error pattern that would, on passage through a g-mask, generate an address with leading zeros (and would at the same time require action in the correction window) would not be properly corrected unless additional steps are taken as part of the correction process. For example, a two bit error in the example above would go undetected when the error bits are in the correction window (underlined) as shown below.

| p1 | p2 | p3 | p4 | p5 | p6 | p7 | p8 | p9 | p10 | Parity Stream |
|----|----|----|----|----|----|----|----|----|-----|---------------|
| 0  | 0  | 0  | 0  | <u>1</u> | <u>1</u> | 0  | 0  | 0  | 0   | <--- direction of parity flow |
| 1  | 0  | 1  | 1  | 1  | 1  |    |    |    |     | gives syndrome bit 0 |
|    | 1  | 0  | 1  | 1  | 1  | 1  |    |    |     | gives syndrome bit 0 |
|    |    | 1  | 0  | 1  | 1  | 1  | 1  |    |     | gives syndrome bit 1 |

The leading syndrome bit would become 1 only when the error has passed the correction points, i.e.

| p5 | p6 | p7 | p8 | p9 | p10 | p11 | p12 | p13 | p14 | Parity Stream |
|----|----|----|----|----|----|-----|-----|-----|-----|---------------|
| 1  | 1  | 0  | 0  | <u>0</u> | <u>0</u> | 0 | 0 | 0 | 0 | <--- direction of parity flow |
| 1  | 0  | 1  | 1  | 1  | 1  |     |     |     |     | gives syndrome bit 1 |
|    | 1  | 0  | 1  | 1  | 1  | 1   |     |     |     | gives syndrome bit 0 |
|    |    | 1  | 0  | 1  | 1  | 1   | 1   |     |     | gives syndrome bit 0 |

To correct this error, the table must recognize that the double "1" error bits have passed the correction window and indicate how far beyond the correction window the error bits are. The next step is to shift back the stream by that many pairs (blocks of size n, in general), effect the repair, recompute the syndrome and continue with the process.

This correction procedure makes use of facts about special error patterns that can pass through the g-mask and generate syndrome addresses with leading zeros and yet require action at the correction window. In general, a table look-up is made only when the leading syndrome bit is 1. Then if necessary, the parity stream is rolled back and appropriate adjustments are made for patterns which may have slipped by. This greatly speeds up the correction process since memory access can be the bottle-neck in high-speed applications.

Figure 6:
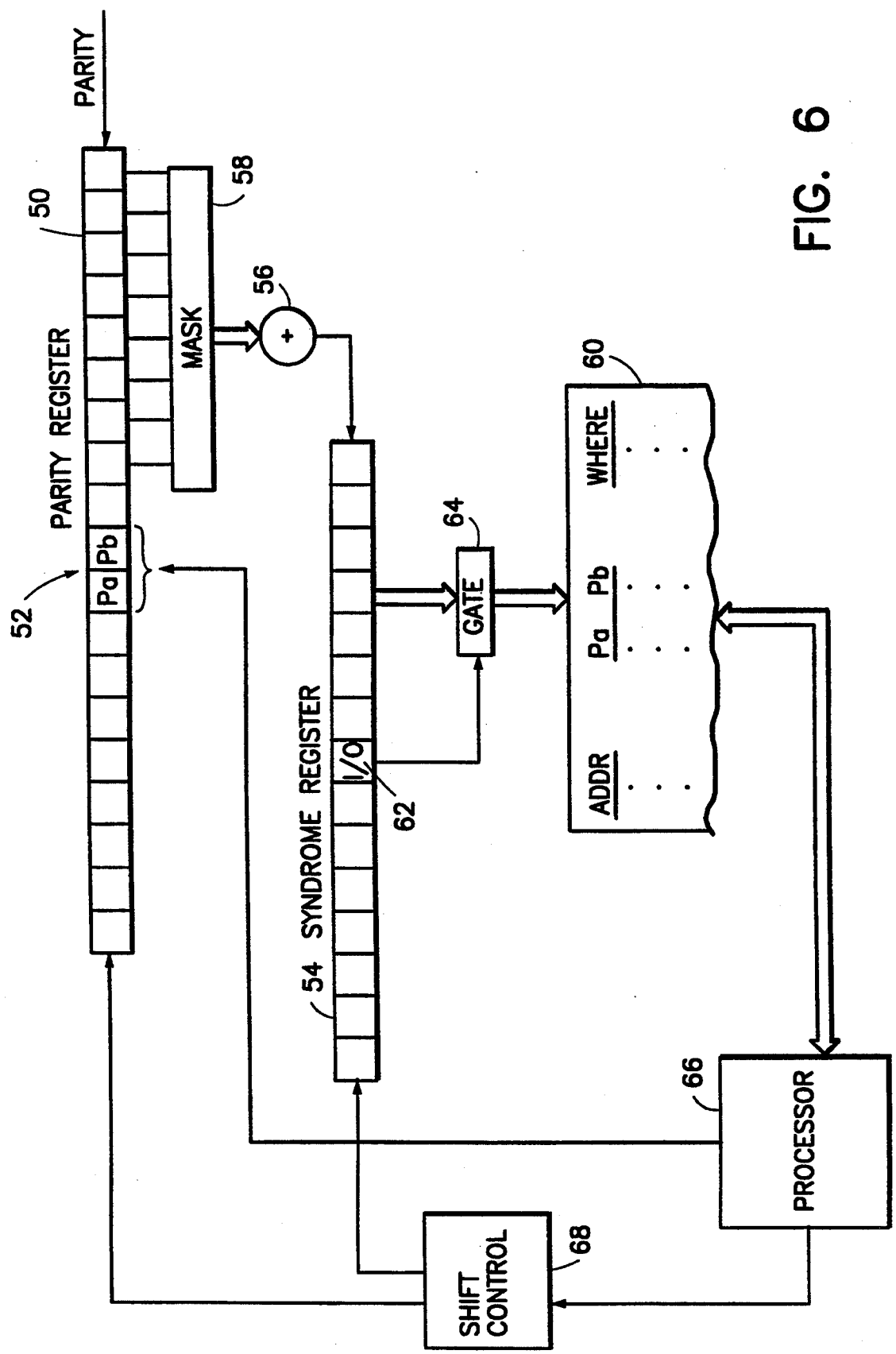
FIG. 6 is a block diagram of a parity error detection/-correction circuit useful for detecting double "one" errors that can escape detection in a correction window.

In FIG. 6 a system is shown for implementing the "Leading 1" correction method. Parity register 50 includes a correction window 52. Syndrome symbol values are inserted into syndrome register 54 via outputs from Exclusive OR 52 that is, in turn, fed through g-mask 58. Syndrome register 54 stores more syndrome bit values than are required to address correction table 60. The most significant bit position (62) of address portion 63 in syndrome register 54 is used to output (via gate 64) the syndrome address to table 60. Gate 64 is operated only when the leading S bit is a 1 which operates to open gate(s) 64.

If the resultant addressed position in table 60 has an entry in the "where" field, it will hereafter be understood that a pair of one bits may have been stepped through correction window 52 without being corrected. In such case, the "where" field indicates where the two one bits are and causes processor 66 and shift control 68 to shift backwards the parity stream (two bits at a time) until the "where" field bits are in correction window 52. The syndrome bits in syndrome register 54 are also shifted backwards (one bit at a time). Then a correction is applied and the process continues. A more detailed description of the procedure follows.

This correction procedure is explained using a ½-rate, L=8 example. The example is based on optimal codes of L=8. The encoding masks are C1=10101111 and C2=11011001. The g-mask, corresponding to this code is the following:

$$\text{g-mask} = 11\ 01\ 01\ 11\ 10\ 01\ 10\ 11.$$

The parity window in this example is 30 bits wide, the correction tables are made for addresses 8 bits long, and the correction window is located at parity bits p15 and p16 (correction point bits are underlined). The parity stream is moving in from the right. In the figures below, p1 is the first bit of the parity stream on the right, p30 is the last parity bit on the left.

Consider an isolated three-bit parity error .. 11 01 .. When the leading "11" enters the correction window, the syndrome bit generated is zero. As above indicated, a look-up in the correction table is performed only if the leading bit of the syndrome address is a "1". So an s-address of 00100001 derived as shown below does not initiate a table look-up.

```
00 00 00 00 00 00 00 11 01 00 00 00 00 00 00  <-- direction of parity flow
            11 01 01 11 10 01 10 11            gives syndrome bit 0
               11 01 01 11 10 01 10 11         gives syndrome bit 0
                  11 01 01 11 10 01 10 11      gives syndrome bit 1
                     11 01 01 11 10 01 10 11   gives syndrome bit 0
```

```
          11 01 01 11 10 01 10 11            gives syndrome bit 0
             11 01 01 11 10 01 10 11         gives syndrome bit 0
                11 01 01 11 10 01 10 11      gives syndrome bit 0
                   11 01 01 11 10 01 10 11   gives syndrome bit 1
```

Since the leading syndrome address bit is zero, the parity stream is then shifted to the left by two bits. The error "11" bits shift past the correction window undetected. The seven pairs of parity bits to the left of the correction window are buffered. Again the leading syndrome bit is zero, so the process is repeated. This is also true for the next shift.

```
00 00 00 00 00 00 11 01 00 00 00 00 00 00 00   <----- direction of parity flow
11 01 01 11 10 01 10 11                        gives syndrome bit 0
   11 01 01 11 10 01 10 11                     gives syndrome bit 1
      11 01 01 11 10 01 10 11                  gives syndrome bit 0
         11 01 01 11 10 01 10 11               gives syndrome bit 0
            11 01 01 11 10 01 10 11            gives syndrome bit 0
               11 01 01 11 10 01 10 11         gives syndrome bit 0
                  11 01 01 11 10 01 10 11      gives syndrome bit 1
                     11 01 01 11 10 01 10 11   gives syndrome bit 1
```

Again the parity stream is shifted two bits to the left. Now the syndrome address is 10000110. The leading bit of the syndrome address is a "1" and a table look-up is required.

Since it is known that every time the table is accessed, the leading address bit is 1, the address does not have to use that bit. Since the tables are made to accommodate 8 bit addresses, one more s-bit is generated at the trailing edge of the address and the table is entered using this new address. Now, effectively, a 9-bit syndrome address is used. In the example below, the address is 00001100.

```
00 00 00 00 00 11 01 00 00 00 00 00 00 00   <----- direction of parity flow
11 01 01 11 10 01 10 11                     gives syndrome bit 1
   11 01 01 11 10 01 10 11                  gives syndrome bit 0
      11 01 01 11 10 01 10 11               gives syndrome bit 0
         11 01 01 11 10 01 10 11            gives syndrome bit 0
            11 01 01 11 10 01 10 11         gives syndrome bit 0
               11 01 01 11 10 01 10 11      gives syndrome bit 1
                  11 01 01 11 10 01 10 11   gives syndrome bit 1
                     11 01 01 11 10 01 10 11 gives syndrome bit 0
                        11 01 01 11 10 01 10 11 gives syndrome bit 0
```

The table entry corresponding to this address may be as follows:

| Address  | p15 | p16 | Where |
|----------|-----|-----|-------|
| 00001100 | 1   | 1   | 010   |

The "where" field indicates which pair of parity bits past the correction window is the one with a previously undetected "11". Here 010 indicates the second pair to the left of the correction window. The correction to be applied to this pair (via an Exclusive OR combination with the error parity bits) is indicated by the p15 and p16 fields in the table. In general, the "where" field indicates the position of the error block that has escaped detection, and the p15 ..p16 field would be replaced by the pattern that needs to be corrected, once the "escaped" block is returned to the correction window. In this example, the parity stream has to be shifted back by two pairs (or four bits), and the correction applied. This is illustrated below the the two 11 bits having been corrected and the syndrome vector recomputed.

```
00 00 00 00 00 00 00 00 01 00 00 00 00 00 00   <-- direction of parity flow
11 01 01 11 10 01 10 11                        gives syndrome bit 0
   11 01 01 11 10 01 10 11                     gives syndrome bit 1
      11 01 01 11 10 01 10 11                  gives syndrome bit 0
         11 01 01 11 10 01 10 11               gives syndrome bit 1
            11 01 01 11 10 01 10 11            gives syndrome bit 0
               11 01 01 11 10 01 10 11         gives syndrome bit 1
                  11 01 01 11 10 01 10 11      gives syndrome bit 1
                     11 01 01 11 10 01 10 11   gives syndrome bit 1
```

The leading bit of the new syndrome address (recomputed after the correction is applied) is now zero, and no look-up is necessary. The correction process continues as before from this point onwards.

The s-address used for table look-up is again computed using the 8 parity pairs following the correction window. The look-up address is 01011110. The table entry corresponding to this address will be as follows:

| Address  | p15 | p16 | Where |
|----------|-----|-----|-------|
| 01011110 | 0   | 1   | 000   |

The "where" field being zero indicates that there are no undetected errors to the left of the correction window. The correction is therefore applied to the current correction pair, and the syndrome address is recomputed. The new address is now 00000000, and the 3-bit error has been corrected as shown below.

```
00 00 00 00 00 00 00 00 00 00 00 00 00 00 00 00  <--  direction of parity flow
11 01 01 11 10 01 10 11                                gives syndrome bit 0
   11 01 01 11 10 01 10 11                             gives syndrome bit 0
      11 01 01 11 10 01 10 11                          gives syndrome bit 0
         11 01 01 11 10 01 10 11                       gives syndrome bit 0
            11 01 01 11 10 01 10 11                    gives syndrome bit 0
               11 01 01 11 10 01 10 11                 gives syndrome bit 0
                  11 01 01 11 10 01 10 11              gives syndrome bit 0
                     11 01 01 11 10 01 10 11           gives syndrome bit 0
```

5. Soft Detection

5.1 Handling Competing Table Entries (or Table Conflicts)

Figure 7:
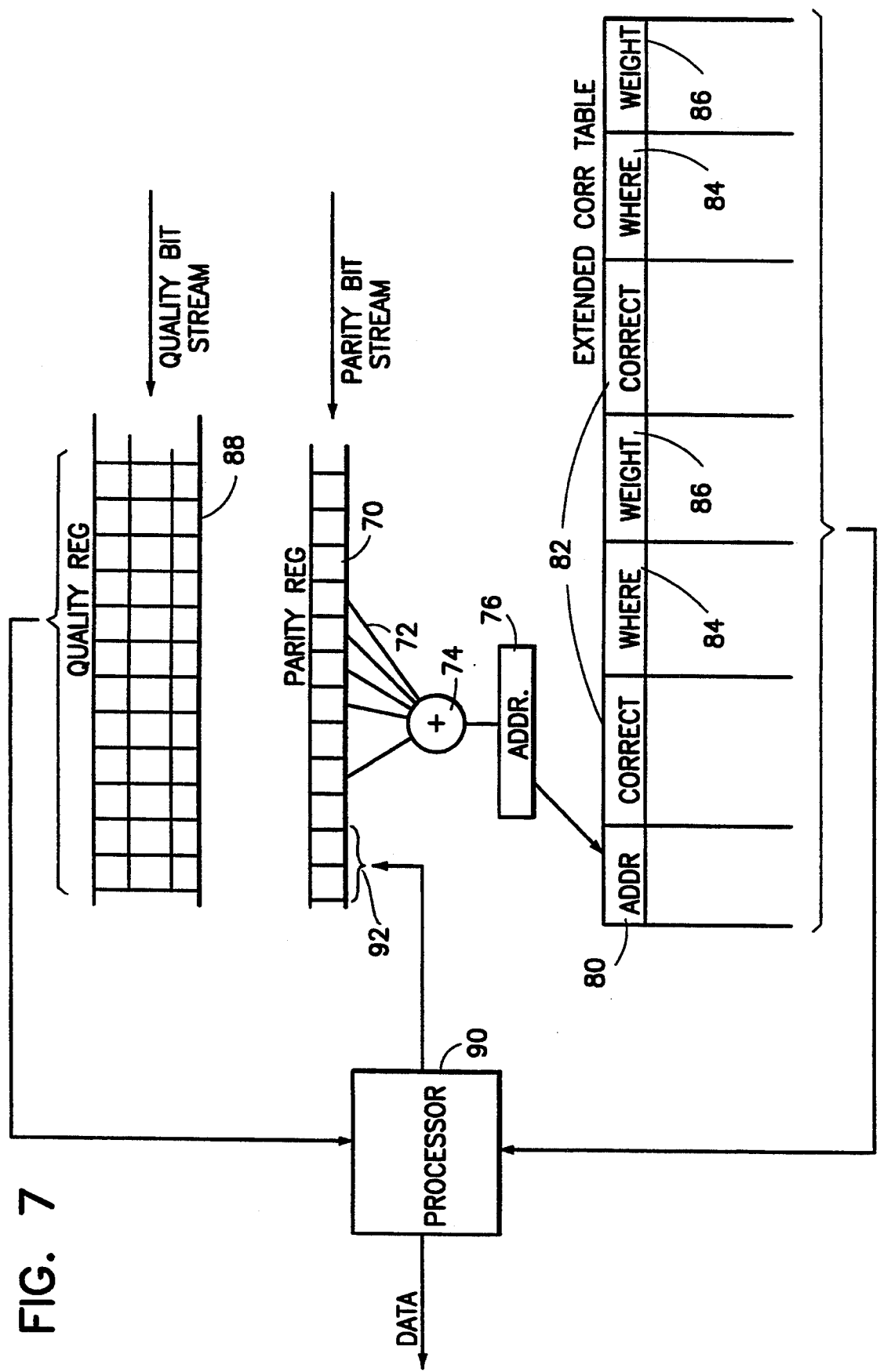
FIG. 7 is a block diagram of a parity error detection/-correction circuit wherein a bit quality register (i.e., signal-to-noise) is employed as an aid in parity correction.

The information stored in the tables can be extended to include the probability of occurrence of all the error patterns that yield a same address. The extension includes inclusion into a table of alternative correction-points, their location in the parity stream and of a "weight" field to indicate the probability of the error pattern associated with the entry that generates this address. The extended table is used in conjunction with the information on the signal-to-noise ratio of the bits in the correction positions to decide which of the alternatives is the most likely one. This is illustrated in FIG. 7.

The parity bit stream passes through the parity register 70 and, via g-mask 72 and exclusive OR device 74, it generates a syndrome address which is stored in register 16. The syndrome address is used to access extended correction table 78 where each address 80 has fields that provide the following information: the location of correction points 82; their position ("where", 84) within parity register 70; and the probability ("weight", 86) that the error pattern associated with each correction point occurs. There is also a "quality" register 88 which parallels the parity register 70 and contains, for each parity bit, information on the signal-to-noise quality of this parity bit. Register 88 can, for each parity bit, store one or more bits of quality information. The probability 86 of each alternative correction pattern 82 at location 84 is combined by a processor 90 with the corresponding quality information from register 88 and the most likely correction is selected and applied at 92.

Soft detection can be applied to the leading-1, full-parity and fractional-parity methods. Computation of the signal to noise metric may be limited to correction points only, or may be extended to as many parity bits in the parity window as desired.

5.2 Soft Detection and Decoding Equations

If all encoded bits are corrected, conversion of the encoded bits to data bits can proceed in a straight forward manner. However, even when some encoded bits are questionable, it is possible to remove several of them from the decoding scheme and still recover the original data. To illustrate this refer to the reduced half rate decoding table in Table 5.1

TABLE 5.2

Redundancy available for decoding of individual data bits. Reduced Decoding Table

| Parity    |           | Data | Mapping |
|-----------|-----------|------|---------|
| 1 1000    | $P_i$     | 1011 |         |
| 2 0100    | $P_{i+1}$ | 1000 |         |
| 3 0010    | $P_{i+2}$ | 0110 |         |
| 4 0001    | $P_{i+3}$ | 0111 |         |
| 5 $P_1P_2P_3P_4$    | $D_1D_2D_3D_4$ | $D_4 = P_1 + P_4$ |
| 6 $P_3P_4P_5P_6$    | $D_2D_3D_4D_5$ | $D_4 = P_3 + P_5 + P_6$ |
| 7 $P_5P_6P_7P_8$    | $D_3D_4D_5D_6$ | $D_4 = P_7 + P_8$ |
| 8 $P_7P_8P_9P_{10}$ | $D_4D_5D_6D_7$ | $D_4 = P_7 + P_8$ |
| 1 2 3 4             | 5 6 7 8        |                   |

(Header for right portion: DaDbDcDd)

Remembering that in this case shifting two parity bits, shifts over one data bit at a time. It can be seen that any given data bit can be derived from $w=2(L-1)$ sets of encoded bits. Given a set of parity bits, one can go to the parity to data table and obtain a set of parity bits to use in the translation which have not been marked as potentially problematic. The marking of these bits can either be obtained from the knowledge of the uncertainty (or conflict) in the table look-up, and/or from the signal to noise ratio for any given bit.

For example, assume that the parity bits that line-up with the decoding window 35 of FIG. 5.2 are bits $P_i$ through $P_{i+3}$. In general, $P_i$ through $P_{i+(w-1)}$. Let these bits be P1 through P4, i.e. the decoding window contains parity bits given in the row 5 of the Table 5.1. These four parity bits can be combined by Exclusive-OR operations to produce Da through Dd data bits which in the case of P1 to P4 parity bits are D1 to D4 data bits. The equations for combining the parity bits to obtain data bits are governed by the reduced decoding table. For example, $Da = 1*P_i + 1*P_{i+1} + 0*P_{i+2} + 0*P_{i+e} = P_i + P_{i+1}$, or $Dd = 1*P_i + 0*P_{i+1} + 0*P_{i+2+1}*P_{i+3} = P_i + P_{i+3}$, etc. Note that * is the AND operator and + is the Exclusive-OR operator and the 1's and 0's are $P_i$ to $P_{i+3}$ counterparts in the data decoding table that line up with a given data bit. In general there are w index values. Then from the Data part of the decoding table it can be seen, for example, that $D_1$ is the Exclusive-OR of the parity bits for which there is a 1 in their row, i.e. $D_1 = P_1 + P_2$, and $D_4 = P_1 + P_4$. Shifting in two new parity bits, P5 and P6, produces one new data bit D5 and provides row 6 in Table 5.1. The appropriate D4 mapping is given in column 7 of the Data part (also shown in row 6 of the Mapping column), etc. Relationships for other data bits can be obtained in a similar way and all the relationships can be stored in a special equation table.

For illustration consider the following:

```
pc pb pa p0 p1 p2 p3 p4 p5 p6      Parity Stream
0  0  0  0  1? 0  0  0  0  0  <---- direction of parity flow
1  0  1  1  1  1                   gives syndrome bit 1
      1  0  1  1  1  1             gives syndrome bit 1
            1  0  1  1  1  1       gives syndrome bit 1

Quality Register
0  0  0  0  1  0
```

Let the bit p1, marked 1?, have poor signal to noise ratio. The address is 111, and Table 4.1 shows there is need to apply the correction to bit p1. Because signal to noise ratio is poor, it is marked as problematic ("1" entry in the Quality Register). P2 is accepted as is (zero in the Quality Register). Since the quality of P1 is suspect, decoding D4 based on relationship $D4 = P1 + P4$ would also be suspect. However, if bits P3, P5 and P6 are not problematic, then D4 can be derived from this second (or some other) relationship. so, to be on the safe side, the correction is not applied and the (potential) error in the parity stream is allowed to remain for the time being.

Next, two more encoded bits P3 and P4 are shifted in. Now the encoded stream image is that given below. Table address 110 indicates conflict for p4. Therefore p4 is marked as potentially problematic.

```
pa p0 p1 p2 p3 p4 p5 p6 p7 p8      Parity Stream
0  0  1  0  0  0  0  0  0  0  <---- direction of parity flow
1  0  1  1  1  1                   gives syndrome bit 1
      1  0  1  1  1  1             gives syndrome bit 1
            1  0  1  1  1  1       gives syndrome bit 0

Quality Register
0  0  1  0  0  1
```

The next two bits that are scrutinized are P5 and P6.

```
p1 p2 p3 p4 p5 p6 p7 p8 p9 p10     Parity Stream
1  0  0  0  0  0  0  0  0  0  <---- direction of parity flow
1  0  1  1  1  1                   gives syndrome bit 1
      1  0  1  1  1  1             gives syndrome bit 0
            1  0  1  1  1  1       gives syndrome bit 0

Quality Register
1  0  0  1  0  0
```

No change is indicated by the correction table at address 100, and both bits are marked as good quality bits. There is now a sufficient number of unmarked (good quality) parity bits to decode bit D4 using the decoding relationship given in row 6 of Table 5.1, i.e., $D4 = P3 + P5 + P6$. Note that the decoding relationship in row 5 of Table 5.1, i.e., $D4 = P1 + P4$ would have given an erroneous value for D4. This decoding scheme avoided the parity bit error from propagating into the decoded data stream.

In some situations (e.g., burst errors, high error rates) it is possible that all relationships for a decoding of a data bit contain at least one problematic encoded bit. In that case an option which gives reasonable results is a table-based minimization of the number of changes that need to be applied to (problematic) encoded bits in order to make all relationships for that data bit agree.

Figure 8:
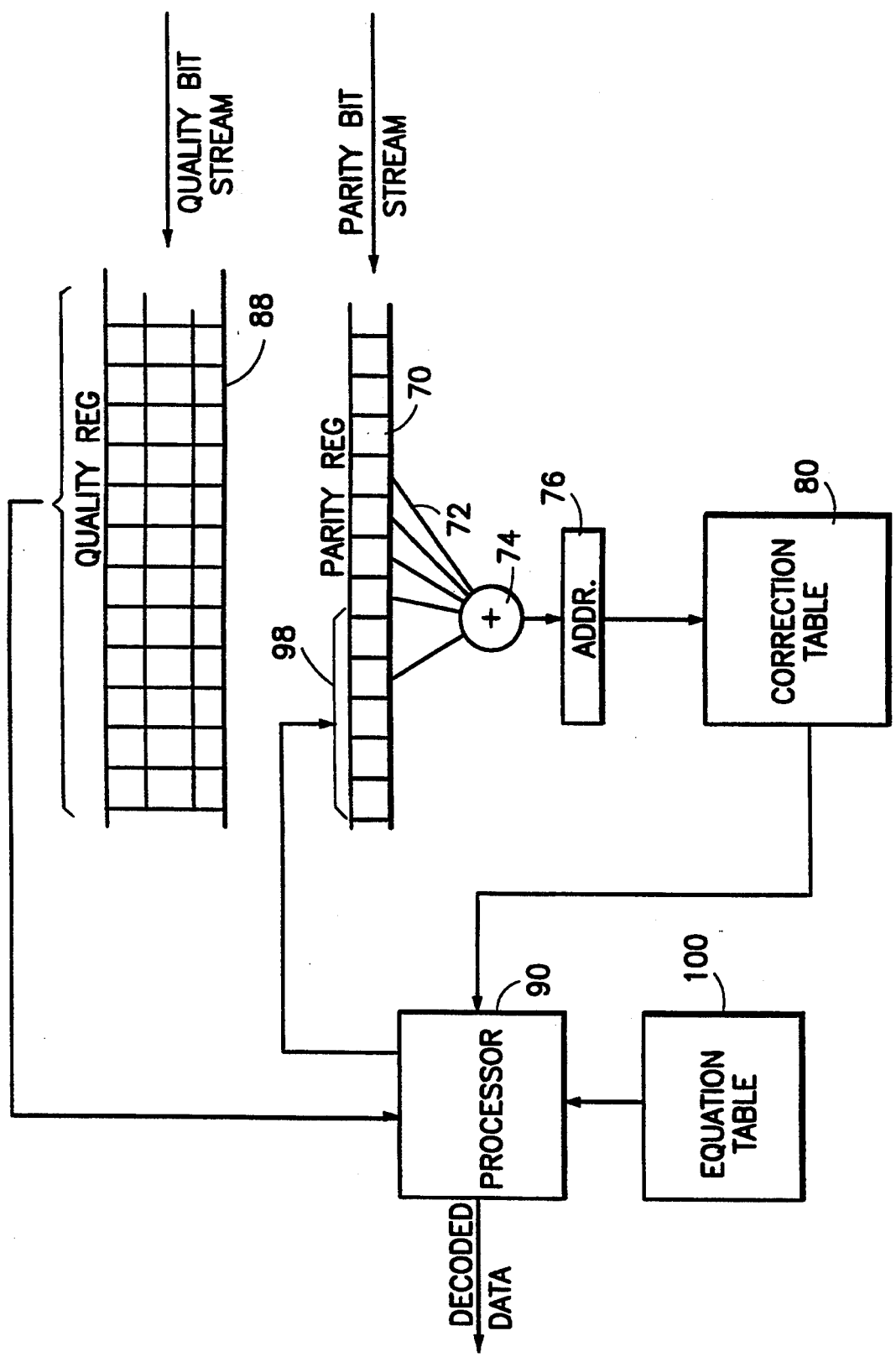
FIG. 8 is a block diagram of a parity error detection/-correction circuit wherein an equation table that makes use of redundant information in the parity stream is employed to recover erroneous parity bits.

With reference to FIG. 8, the process is as follows. The parity bit stream passes through parity register 70 and via g-mask 72 and exclusive OR device 74, it generates a syndrome address that is stored in register 76. The parity stream is tracked by a quality stream that passes through register 97 where for each parity bit there are one or more quality bits based on signal-to-noise ratio. The syndrome address is used to access a correction table 80. Information from correction table 80, from the quality stream 97, and the equation table 100 is combined by processor 90 to decide which of the parity bits 98 has the highest quality and which of decoding equations 100 to use. The equations are applied by processor 90 and decoded data 110 is output k bits for every n bits of parity.

6. A Method of Correcting Using Special Parity Patterns

There are special parity error patterns that produce an error syndrome of zero. In general, these patterns can be computed by passing through g-masks, error patterns and retaining only those that produce a syndrome vector of zero. For example, half rate convolutional codes 011 and 111 have as a basic "zero" 111101. In this case, as well as in the case of all half rate codes, the basic "zero" turns out to be the g-mask in reverse. Other "zero" patterns can be formed by shifting the basic pattern by a multiple of n parity bits (n=2 in this case), and combining these new patterns through Exclusive OR operations. If a given pattern of parity bits P produces a certain syndrome vector S, then any "zero" pattern that is combined with P through a bitwise Exclusive OR operation results in exactly the same syndrome vector S.

This property is used in a procedure by which one can generate the error pattern with the minimum number of errors that correspond to a particular syndrome address. This process begins by obtaining an initial error pattern, usually not the minimum, for this address. First, the pattern that corresponds to a syndrome vector with a single one in the address is generated (or read from a table). This starting syndrome vector is then shifted into all the positions where there is a one in the syndrome address for which it is wished to determine the correction pattern. The corresponding parity patterns are also shifted, but n-bits at a time for every single bit shift in the syndrome space. Then all these parity error patterns are Exclusive Or'd, starting with the minimum "zero" pattern shifted to different shift positions with the aim of minimizing the number of errors represented by "1"s in the parity window. Since each of the applications of this "zero" minimization vector has a zero syndrome, the address will remain unchanged while the error pattern will be minimized.

Using the half rate example, suppose there is a single bit error represented as 0100000000.

Passing this pattern through g-mask 101111 from the right gives address 110. A single-bit syndrome pattern represented by 100 gives an error pattern of 1001000000. The initial error pattern is formed in the following way

| Syndrome | Parity Error | |
|---|---|---|
| 110 | | Original address |
| 100 | 1001000000 | Initial address and error |
| 100 | 1001000000 | Initial shifted |
| 110 | 101101000000 | Initial pattern for 110 address |

110 is the address for which the initial pattern was formed. This initial error pattern is Exclusive OR'd with the basic "zero"

101101000000
111101
<u>010000000000</u>

Because, the (underlined) error pattern that is obtained has only one bit in error, this is the minimum error pattern. It is the same as the one assumed at the beginning. Note that this pattern can now be applied to the parity window to remove the errors and is obtained without resorting to correction tables. the correction can be applied over the whole parity window or only in specific correction positions. Furthermore, the initial pattern generation process can be done in many ways. Frequently, the process may require repeated application of many different "zero" parity patterns. This process can be used in combination with correction tables which contain pre-computed minimal parity error patterns for subsets of syndrome addresses.

Figure 9:
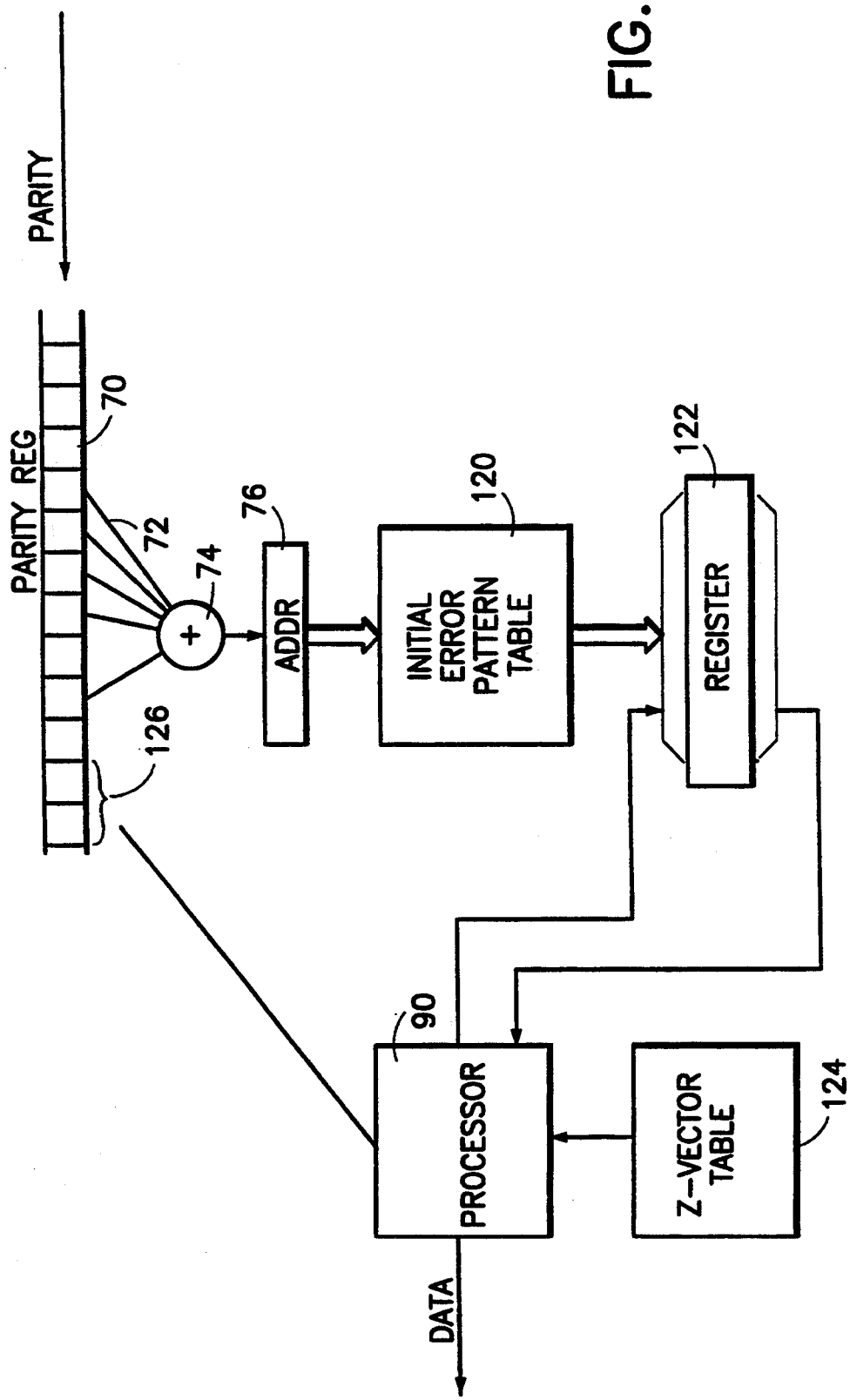
FIG. 9 is a block diagram of a parity error detection/-correction circuit wherein certain zero parity patterns are employed to recover erroneous parity bits.

The process is illustrated in FIG. 9. The parity bit stream passes through the parity register 70, and via g-mask 72 and exclusive OR device 74, it generates a syndrome address that is stored in register 76. The syndrome address is used to access an initial error pattern table 120 to store into register 122 the initial pattern corresponding to the address in register 76. Processor 90 accesses table 124 which contains "zero" parity patterns based on g-mask 72. These zero patterns are repeatedly applied to the pattern in register in 122 until a minimum error pattern is obtained, i.e., a parity pattern composed of the least number of erroneous bits which give rise to the address in register 76. The minimum pattern is used by processor 90 to correct the parity stream in register 70 at correction window 126.

7. Cell Loss Recovery

The one-to-one mapping principle is used to recover cells lost during transmission over a switched network. Suppose that the input message is a series of 2-bit cells 10 01 10 10 11 01 11 00. This message is encoded using a ⅔-rate code with L=4 and C1=0111, C2=1011, and C3=0001. Using the reduced encoding table shown in Table 2.2, the data stream is encoded as follows:

| Data Bits | Parity Bits |
|---|---|
| 10 01 10 | 101 010 |
| 01 10 10 | 010 100 |
| 10 10 11 | 100 011 |
| 10 11 01 | 011 001 |
| 11 01 11 | 001 101 |
| 01 11 00 | 101 110 |

The encoded message is a sequence of 3-bit cells 101 010 100 011 001 101 110. This message is transmitted over the channel. It is assumed that the order of each cell within the message is known. In an actual situation (e.g., a packet in a packet-switched network), the sequence number of a cell is part of the cell itself and order reconstruction takes place before the information parity parts of the cells are decoded. Assume also that there are no errors during transmission due to channel noise, i.e., no parity bit is erroneously changed due to channel noise.

Assume also that a cell is lost during transmission due to, say, buffer overflow at an intermediate switching station (let the fourth 3-bit cell be lost). The received message is now 101 010 100 —001 101 110.

As indicated above, the position of the lost cell within the sequence is known since the cells carry ordering information. The one-to-one mapping principle guarantees that successive decoded data blocks overlap, and that in the absence of errors, the overlapped bits are the same. The decoding table shown in Table 2.3 is used to reconstruct the received message as follows:

| Parity Bits | | | | | | Reconstructed Data Bits | | |
|---|---|---|---|---|---|---|---|---|
| 101 | 010 | | | | | 10 01 10 | | |
| | 010 | 100 | | | | 01 10 10 | | |
| | | 100 | — | | | — — — | | |
| | | | — | 001 | | — — — | | |
| | | | | 001 | 101 | | 11 01 11 | |
| | | | | | 101 110 | | 01 11 | 00 |

Since it is assumed that there are no noise induced errors in individual parity bits, the redundancy built into the coding scheme and the one-to-one principle allows reconstruction of the message without the use of all parity blocks. Noise induced errors would have been detected, but if they corrupted any of the cells used to reconstruct the message after cell loss, the repair of these received cells would have to be effected before the reconstruction took place.

Appropriate coding rate and length can be selected for a given cell size and the average number of lost cells, and the one-to-one mapping principle can be employed as described above.

8. Code Selection

Codes have to satisfy two main criteria:
1. Codes must result in "invertible" data to parity tables, i.e., they must satisfy the one-to-one correspondence in a unique way to enable unique mapping between data to parity and back.
2. Codes must have adequate error correcting power given the correction algorithm and syndrome address size. When selecting code words a length L is chosen first. Then the code is checked to see if it is invertible, and finally the correcting of the code is checked. By adjusting the code and the correction window to minimize the number of conflicts, it is possible to select an optimal code of length L. If this does not yield adequate results, both L and syndrome address size may have to be increased, or another correction method chosen.

A simple, reliable, and fast way of developing good codes for table-driven decoding is to actually generate the tables in accordance with the exact process that they would be used in. Then, the tables are analyzed for conflicts and tuning is performed through changes in the code-words, and correction positions. An example follows.

A typical cycle consists of 1) defining the actual code words (size and content), 2) defining the size of the parity window, 3) generating all possible combinations of one, two, three, four, five, six etc. bit errors within the parity window, 4) passing each of the errors through the g-masks), 5) computing the syndrome address(es), 6) entering the correction point values into the table, 7) if there are any conflicts in the table entries, the higher probability entries are retained (for example, two-bit errors are generally more likely to occur than 5-bit errors), and 8) when the table is complete, the table is analyzed for conflicts and a determination made as to when and with what probability the tables will be able to correct errors of a given size.

The example is based on a half-rate coding and decoding process, L=8, and a 20 bit syndrome address. The size of the address together with L implies a parity window of 40 bits. The maximum table address is $2^{20}=1,048,576$ bits. Hence, the needed memory size is 1,048,576 times the number of entries times the size of each entry per address. In a parity window 40 bits wide it is possible to have 40 one-bit errors, or 780 two-bit errors, or 9870 three bit errors, or 90874 four bit errors, or 644770 five bit errors, etc. The aim in this example is to provide a code which can guarantee a correction of any 4-bit error within the 40-bit window, and can cope, as best as possible, with higher order errors. Let the correction window encompass bits 40 and 39 of the parity window, where bits 1 and 2 are the positions into which the incoming parity pairs are shifted first when they enter the parity window.

Suppose that the code words are 11011001 and 10101101. These code words yield no conflicts for one, and two bit errors. This means that these code words and a correction table would guarantee correction of all one and two bit errors. However, there are 10 conflicts for three bit errors, 511 for four-bit errors, 12949 for five bit errors, etc. It is assumed that all three-bit errors are equally likely to occur, the probability that this table will successfully correct three bit errors is (9870−10)/9870=0.9990, similarly it is (90874−511)/90874=0.9944 for four bit errors, and(644770−12949)/644770=0.9799 for five-bit errors, etc.

A change in the code words to 11011001 and 10101111 (note the difference in the second to last bit of the second code word) yields no conflicts for one, two, three and four bit errors, 3906 conflicts for five-bit errors, and 151293 for six bit errors, etc. It is obvious that these new code words improve the error correcting properties of the process. Correction of all one, two, three and four bit errors in a 40-bit parity window is now guaranteed, while only 3906 out of 653733 five-bit errors, and 151293 out of 3651316 six bit-errors are not corrected on the average.

Keeping the code words the same, i.e. 11011001 and 10101111, but shifting the correction window to positions 38 and 37 results in no conflicts for one, two, three and four bit errors, but increases, for example, five bit conflicts to 8230. This is obviously worse than the previous case so this change is not accepted.

The process above can be continued as necessary.

9.3/5 Coding Example

9.1 Table-Based Encoding

An encoder can be constructed (as above described) by specifying an encoding table which contains a unique w-bit parity block for each unique w-bit data block. The size of this table is $2^w$ for binary data since a w-bit block can take $2^w$ values. However, as also indicated above, the table can be reduced in size. The reduced table contains only w basis elements. Each one of the entries is w bits wide and one side of the table has entries which have a single 1 in the position different from any other element while the rest of the bits are zero. If the codes are appropriate elements of a reduced table can be combined using modulo 2 arithmetic to produce any needed combination of the data or parity patterns w bits long.

Using a 3/5-rate code with L=7, let C1=1011101, C2=1110110, C3=1001011, C4=0101010, and C5=1011111 be the encoding masks. The one-to-one mapping length is w=10. This means that 10-bit blocks of data bits should correspond uniquely to 10-bit blocks of parity bits. In general, there would be $2^w$ entries in a full table, but the reduced encoding table given in Table 9.1 requires only w entries.

TABLE 9.1

| \<------direction of data/parity flow---- | |
|---|---|
| Reduced Encoding Table | |
| Date Bits | Parity Bits |
| 1000000000 | 1110100000 |
| 0100000000 | 0101000000 |
| 0010000000 | 1100100000 |
| 0001000000 | 1011111101 |
| 0000100000 | 0111111001 |
| 0000010000 | 0111111001 |
| 0000001000 | 1010110111 |
| 0000000100 | 0000011001 |
| 0000000010 | 0000001111 |
| 0000000001 | 0000010101 |

In general, the encoding window is w data bits wide. These w data bits are processed as a block into w parity bits using the encoding table. Then k new data bits are shifted into the encoding window (or register) and another block of w parity bits are produced. This new block overlaps the end of the previous parity block by its first w−n parity bits. If there are no errors in the construction of the table these overlapping parity bits must be identical. The process repeats until all data bits have been mapped. It is important to note that while the data stream moves k bits at a time, only n new parity bits are produced for each block of w parity bits obtained from the encoding table.

9.2 Table-Based Decoding

If the mapping is unique then each w-bit parity bits can be decoded into the corresponding w-bit data block. The resulting decoding table is shown in Table 9.2

TABLE 9.2

Reduced Decoding Table

| parity Bits | Data Bits |
|---|---|
| <---direction of parity/data flow--- | |
| 1000000000 | 1011111100 |
| 0100000000 | 0111101000 |
| 0010000000 | 1010000000 |
| 0001000000 | 0011101000 |
| 0000100000 | 1110010100 |
| 0000010000 | 0010100011 |
| 0000001000 | 1101000001 |
| 0000000100 | 1101000100 |
| 0000000010 | 1111100001 |
| 0000000001 | 1111100110 |

Given that there are no errors in the parity stream, decoding process becomes one of applying an exact reverse of the encoding process, i.e. a block of w parity bits is mapped into w data bits using the decoding table. After each block is produced another n parity bits are moved into the decoding window. The first w-k bits of the new data block will overlap the last w-k bits of the previous data block. If there are no errors in the parity stream the overlapping data bits should match exactly, i.e. bit by bit Exclusive-OR of the overlapping sections will be zero.

However, if there are errors present in the parity stream the overlapping data sections will not match and will produce non-zero values when Exclusive OR'd. These values represent syndrome symbols. A series of the symbols represents a syndrome vector. The number of symbols is the same as the number of overlap differences and the sequence of zeros and ones form an address for the correction table. In this example four distinct symbols are generated by the Exclusive OR action, when there is an error in the parity. Two bits are thus needed to be used to record the information.

9.3 Error Detection

Errors in the parity stream are detected using the syndrome vector. Although the syndrome vector can be generated either through repeated application of the decoding tables a more efficient way is by using of the g-mask.

The following illustrates the process of g-mask generation for a 3/5-rate code with L=7. Let C1=1011101, C2=1110110, C3=1001011, C4=0101010, and C5=1011111 be the encoding masks. The one-to-one mapping length is w=10. This means that 10-bit blocks of data bits should correspond uniquely to 10-bit blocks of parity bits.

At the receiver, the parity stream for 3/5 coding, i.e. k=3 and n=5, is processed in 5-bit blocks. The g-mask is generated by considering parity streams with single-bit errors in each of the positions P1–P5 in the five bit parity block.

Assume the data is all zero and that an error occurs in position P1 of the third block of the following parity stream which is moving from right to left 00000 00000 10000 00000 00000. Assume further that the decoding window (w=10 bits wide) is positioned on leftmost side of the shown stream segment (underlined). The first 10-bits of the stream map into the following data bits: 00 00 00 00 00. Next, the stream moves by three bits and the next 10-bit block in the window is 00000 10000. The corresponding data block is 00 10 10 00 11 (see table 9.2). Moving the parity stream by 5 more bits results in 10000 00000 as the parity block, and 10 11 11 11 00 as the data block. Finally, the parity block 00000 00000 decodes into 00 00 00 00 00. The overlap between successive parity and data blocks is illustrated in the figure below. Note that because of the error, the differences between successive data blocks generated around the error are not zero. In fact, a five-bit block with an error in the P1 bit took two five-bit shifts to move through the 10-bit decoding window and the block with the error in it contributed to three differences (or syndrome symbols) before it moved out of the width of the mapping table.

| <-----direction of parity/data flow--- | | |
|---|---|---|
| 00000000001000000000000000 | | |
| Parity Difference | Data | XOR |
| 0000000000 | 0000000000 | |
| 0000010000 | 0010100011 | 0010100 |
| 1000000000 | 1011111100 | 1111100 |
| 0000000000 | 0000000000 | 1111100 |

The overlap between the 10-bit data blocks is 7 bits long. The overlapping bits are Exclusive ORed, as shown above.

In a similar manner syndrome patterns are generated for errors in positions P2, P3, P4, and P5. The Exclusive OR sums obtained for each of these cases are shown in table 9.3. Those sums constitute the syndrome sequence corresponding to the parity stream with single-bit errors in each of the parity positions. The three binary syndrome values under each parity position indicate the syndrome generated when a single bit error in the parity position is shifted through the parity window (3 shifts).

TABLE 9.3

Syndrome sequences for single-bit error using 7-bit symbols.

| P1 | P2 | P3 | P4 | P5 |
|---|---|---|---|---|
| 0010100 | 1101000 | 1101000 | 1111100 | 1111100 |
| 1111100 | 1111100 | 0010100 | 1111100 | 0010100 |
| 1111100 | 1101000 | 0000000 | 1101000 | 0010100 |

Note that the Exclusive OR overlap sums take four distinct 7-bit values. It is possible to represent the four sums using 2-bit binary numbers. The symbols can thus be represented as shown in table 9.4.

TABLE 9.4

Syndrome Symbol Representation

| Symbol | Representation |
|---|---|
| 0000000 | 00 |
| 1111100 | 01 |
| 1101000 | 10 |
| 0010100 | 11 |

The syndrome sequences using the representation of table 9.4 are shown in table 9.5.

TABLE 9.5

Syndrome sequences for single-bit errors using 2-bit symbols

| P1 | P2 | P3 | P4 | P5 |
|---|---|---|---|---|
| 11 | 10 | 10 | 01 | 01 |
| 01 | 01 | 11 | 01 | 11 |
| 01 | 10 | 00 | 10 | 11 |

Table 9.6 shows the syndrome sequences corresponding to the first syndrome bit and table 9.7 shows the sequences corresponding to the second syndrome bit of each two-bit symbol shown in table 9.5

TABLE 9.6

| P1 | P2 | P3 | P4 | P5 |
|----|----|----|----|----|
| 1  | 1  | 1  | 0  | 0  |
| 0  | 0  | 1  | 0  | 1  |
| 0  | 1  | 0  | 1  | 1  |

TABLE 9.7

| P1 | P2 | P3 | P4 | P5 |
|----|----|----|----|----|
| 1  | 0  | 0  | 1  | 1  |
| 1  | 1  | 1  | 1  | 1  |
| 1  | 0  | 0  | 0  | 1  |

9.4 g-mask

The g-masks can now be derived using the syndrome sequences shown in tables 9.6 and 9.7. Because two bits are used to represent each syndrome symbol, two distinct g-masks are required to compute these bits. The five characteristic syndrome patterns are interleaved as follows to wire the two g-masks which then generate syndrome bits based on the parity stream. The g-mask connections are shown interleaved in FIGS. 10 and 11.

The patterns in FIGS. 10 and 11 are the g-masks and are used to detect errors in the parity stream and generate syndrome addresses without direct use of the decoding table.

Once the g-mask is known for a code, the receiver can use it to calculate the syndrome sequence. The syndrome sequence so generated is used as an address to access a table which would indicate which of the parity bits is in error. This correction table provides information to be used by the correction register for correcting the parity stream. The correction register for the example code will be 5 bits long because there are 5 distinct parity bits in each parity block. Furthermore, the syndrome addresses will be longer since there are two syndrome bits generated during each cycle, i.e., each time parity stream shifts by 5 bits and the syndrome is computed the two g-masks generate one bit each. This is shown in FIG. 12.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A system for convolutionally encoding and decoding a bit stream, n code words employed to encode said bit stream to produce n parity bits for each k data bits, where n is an integer greater than two, each code word having a bit length equal to L, said system comprising:
   convolutional encoding means for sequencing data bit sets into a window w bits in length, each data bit set k bits long, and for converting bits in said window to an integral number of n bit parity bit sets of w bits in length, and repeating said process when a new data bit set replaces an old data bit set in said window, each said w-length set of parity bit sets being shifted from a previous w length set of parity bit sets by n bits, where $w=n(L-k)/(n-k)$, w being a length of data bits, which when encoded using code words of length L, exhibit a unique relationship to w parity bits, each and every combination of said w data bits giving rise to a unique w parity bits;
   error detection means for receiving successive parity bit sets and for deriving syndrome values from each said set, each syndrome value generated by a connection mask between said received parity bit sets and Exclusive OR means, said connection mask dependent upon said n code words;
   correction table means responsive to a series of syndrome values from said error detection means to provide parity bit correction signals;
   means for altering said parity bit stream in accordance with said parity bit correction signals; and
   means for converting said altered parity bit stream to a data bit stream.

2. The system as defined in claim 1 wherein said error detection means further comprises:
   register means; n-k Exclusive OR means, each connected to said register means in accordance with a different connection mask, for generating a syndrome value called a syndrome symbol for a series of parity bit sets in said register means, a connection mask comprised of like order bits from a series of syndrome values, said syndrome values derived by a shifting of single bit parity errors through the register means, each syndrome symbol represented by n-k bits, each said Exclusive OR means producing a series of syndrome symbols as said parity bit stream is shifted in n bit sets through said decoding register; and
   address means responsive to a combined sequence of said syndrome symbols from all said Exclusive OR means, for providing an address for said correction table.

3. The system as recited in claim 2 wherein said syndrome values that comprises syndrome symbols are interleaved to create a correction table address.

4. The system as recited in claim 1 wherein said correction table means is only addressed by non-zero syndrome symbol addresses from said decoding means having a one bit in the most significant bit position of the address.

5. The system as recited in claim 4 wherein said non-zero syndrome symbol address is employed as an address for said correction table means, but the most significant bit position does not form part of the address.

6. The system as recited in claim 4, wherein said means for altering said parity bit stream includes an n-bit storage correction window and further storage positions for a plurality of earlier parity bits that earlier have been shifted through said correction window; and
   correction means for altering selected ones of said earlier parity bits in response to a syndrome symbol address that is created by parity errors in said parity bit stream.

7. The system as recited in claim 6 wherein said parity errors in said earlier parity bits are determined when a syndrome symbol address is generated by parity bits occurring later in time and positioned in said correction window.

8. The system as recited in claim 7 wherein said correction table means includes both parity bit correction values and a position indication of where a said parity bit correction value should be inserted by said altering means.

9. The system as recited in claim 8 wherein said position indication is zero except when a correction value is to be substituted for an earlier parity bit.

10. A system for decoding a convolutionally encoded parity bit stream exhibiting a coding rate of n parity bits for each k data bits, the combination comprising:
storage means having stages for receiving a plurality of sets of n parity bits;
logic means for providing an Exclusive OR function;
means for interconnecting said stages to said logic means in a manner governed by code words used to encode said parity bit stream;
means for sequentially shifting n parity bits at a time into said storage means, each shift in said storage means causing output from the logic means of a syndrome value called a syndrome symbol, certain different parity error patterns in said storage means causing issuance of identical series of syndrome symbols; table means for storing and issuing n bit correction values, each said correction value addressed by a syndrome series that occurs as a result of an erroneous parity value, certain syndrome addresses causing said table means to indicate ambiguity regarding a correction value, said table means further including an indication of where in said parity bit stream, a further parity bit set resides that should be accessed to enable possible resolution of said ambiguity;
means responsive to said indicated ambiguity to derive a further syndrome symbol from said further parity bit set and to employ said further syndrome symbol and said table means to resolve said ambiguity; and
correction means for storing the n-bit parity sequence that resulted in issuance of a syndrome address that caused said table means to indicate said correction value ambiguity and responsive to said non ambiguous correction value to alter said n bit parity sequence accordingly.

11. The system as recited in claim 10, wherein said table means includes an Exclusive OR function responsive to erroneous parity stored in said correction means and to issue correction values, to insert corrected parity into said correction means.

12. The system as recited in claim 11 wherein a correction window access means is positioned to access a parity bit set within said correction window in said parity bit stream and said further parity bit set can reside on either side of said correction window.

13. The system as recited in claim 12 wherein said further parity bit set is only chosen from parity bit sets that have not passed through said correction window.

14. A system for convolutionally encoding and decoding a bit stream, n code words employed to encode said bit stream to produce said n parity bits for each k data bits, each code word having a bit length equal to L, said system comprising:
convolutional encoding means for sequencing data bit sets into a window w bits in length, each data bit set k bits long, and for converting bits in said window to an integral number Of n bit parity bit sets of w bits in length, and repeating said process when a new data bit set replaces an old data bit set in said window, each said w-length set of parity bit sets being shifted from a previous w length set of parity bit sets by n bits, where $w=n(L-k)/(n-k)$, w being a length of data bits, which when encoded using code words of length L, exhibit a unique relationship to w parity bits, each and every combination of said w data bits giving rise to a unique w parity bits; decoding means for converting successive sets of n parity bits of w bits in length, to data bit sets of w bits in length, each succeeding conversion resulting in k new data bits and occurring after a new n-bit set of parity bits is shifted into said decoding means, thus creating a new group of parity bit sets, w bits in length;
means for deriving an Exclusive OR function upon each said shift, from overlapping w-length sets of said data bits, each shift causing a k-bit offset of resultant w-length data bit sets, said Exclusive OR function equalling zero if no parity errors are present in said successive sets of parity bits from which sets of data bits are derived;
means for reconstituting lost data bits that result from lost parity bits, by replacing said lost data bits with data bits from an overlapping portion of a said w-length set of data bits.

15. The system as recited in claim 14 wherein said Exclusive OR function combines all bits in each overlapping column of w-length sets of data bits, and said means for reconstituting operates upon the assumption of no parity bit errors in the received parity bit stream and enables said missing data bits to be reconstituted by copying the bit state of a bit in another data bit set, said data bit resident in the same column as said missing data bit.

16. A system for convolutionally encoding and decoding a bit stream, n code words employed to encode said bit stream to produce n parity bits for each k data bits, where n is an integer greater than two, each code word having a bit length equal to L, said system comprising:
convolutional encoding means for sequencing data bit sets into a window w bits in length, each data bit set k bits long, and for converting bits in said window to an integral number of n bit parity bit sets of w bits in length, and repeating said process when a new data bit set replaces an old data bit set in said window, each said w-length set of parity bit sets being shifted from a previous w length set of parity bit sets by n bits, where $w=n(L-k)/(n-k)$, w data bits exhibiting, when encoded using code words of length L, a unique relationship to w parity bits, each and every combination of said w data bits giving rise to a unique w parity bits;
decoder means for receiving successive parity bit sets and for converting w-bit length parity bit sets to w-length data bit sets.

17. The system as recited in claim 16 wherein said decoder means comprises:
error detection means including register means for receiving successive parity bit sets and for deriving syndrome values from each said set, each syndrome value generated by a connection mask between said received parity bit sets in said register means and Exclusive OR means, said connection mask dependent upon said n code words;
quality register means for manifesting data quality indicators for said received parity bits;
correction table means responsive to a non-zero address including a series of syndrome values from said error detection means, to provide parity bit correction signals, certain addresses in said correction table means generated by a plurality of parity bit error patterns, each said address in said table including an entry for each parity bit error pattern indicating its probability of occurrence as compared to other parity bit error patterns that give rise to the identical address;

processor means for combining data quality indicators from said quality register means and said probability occurrence entries from said correction table means and for determining the most probable parity correction values from said correction table means for an indicated series of syndrome values.

18. The system as recited in claim 16, wherein said decoder means comprises:

error detection means for receiving successive parity bit sets and for deriving syndrome values from each said set, each syndrome value generated by a connection mask between said received parity bit sets and Exclusive OR means, said connection mask dependent upon said n code words;

correction table means responsive to a non-zero syndrome address to provide parity bit correction signals, a said syndrome address generated by plural parity bit error patterns, patterns with lesser numbers of bit errors being more probable in occurrence;

means for storing a special non-zero parity error pattern which, when passed through said connection mask and Exclusive OR means, causes a zero value syndrome address.

processor means for combining said special non-zero parity error pattern and a selected parity error pattern that gives rise to a said syndrome address, to derive a parity pattern with the least number of errors that gives rise to said syndrome address and to access from said correction table means, correction bits in accordance with said derived parity error pattern.

19. The system as recited in claim 16, wherein said decoder means comprises:

means for converting successive sets of n parity bits of w bits in length, to data bit sets of w bits in length, each succeeding conversion resulting in k new data bits and occurring after a new n-bit set of parity bits is shifted into said converting means, thus creating a new group of parity bit sets, w bits in length, said converting means employing said unique relationship between w lengths of parity and data bits;

means for storing equations that define Exclusive OR relationships between parity bit combinations that give rise to determined data bits; and processor means for employing said stored equation to derive data bits when uncertainty is present as to the identity of a data bit as a result of operations of said decoder means.

* * * * *